(12) United States Patent
Bawell et al.

(10) Patent No.: US 9,293,262 B2
(45) Date of Patent: Mar. 22, 2016

(54) DIGITALLY TUNED CAPACITORS WITH TAPERED AND RECONFIGURABLE QUALITY FACTORS

(75) Inventors: Shawn Bawell, Amherst, NH (US); Robert Broughton, Chester, NH (US); Peter Bacon, Derry, NH (US); Robert W. Greene, Lowell, MA (US); Tero Tapio Ranta, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 316 days.

(21) Appl. No.: 13/586,738

(22) Filed: Aug. 15, 2012

(65) Prior Publication Data

US 2013/0208396 A1  Aug. 15, 2013

Related U.S. Application Data

(63) Continuation-in-part of application No. 12/735,954, filed on Mar. 2, 2009, now Pat. No. 9,024,700.

(60) Provisional application No. 61/067,634, filed on Feb. 28, 2008.

(51) Int. Cl.
*H01G 7/00* (2006.01)
*H03H 7/38* (2006.01)
*H01G 5/00* (2006.01)

(52) U.S. Cl.
CPC .. *H01G 7/00* (2013.01); *H03H 7/38* (2013.01)

(58) Field of Classification Search
CPC .......................................................... H07G 7/00
USPC ........................... 333/172–174; 327/337, 554
See application file for complete search history.

(56) References Cited

U.S. PATENT DOCUMENTS

| 3,646,361 | A | 2/1972 | Pfiffner |
| 3,699,359 | A | 10/1972 | Shelby |
| 3,975,671 | A | 8/1976 | Stoll |
| 3,988,727 | A | 10/1976 | Scott |

(Continued)

FOREIGN PATENT DOCUMENTS

| CN | 1256521 | 6/2000 |
| DE | 19832565 | 8/1999 |

(Continued)

OTHER PUBLICATIONS

"An Ultra-Thin Silicon Technology that Provides Integration Solutions on Standard CMOS", Peregrine Semiconductor, 1998.

(Continued)

*Primary Examiner* — Dean Takaoka
*Assistant Examiner* — Alan Wong
(74) *Attorney, Agent, or Firm* — Jaquez Land Richman LLP; Martin J. Jaquez, Esq.; Alessandro Steinfl, Esq.

(57) ABSTRACT

The present disclosure describes tuning capacitors with tapered and reconfigurable quality factors. Digitally tuned capacitors (DTCs) that provide a variable quality factor (Q) while maintaining a constant or near constant capacitance as well as DTCs that provide one or more Q values in a tapered distribution while maintaining a constant or near constant capacitance are described. The present disclosure also describes DTCs that provide one or more capacitances in a tapered distribution and one or more Q values in a tapered distribution.

22 Claims, 16 Drawing Sheets

| | bit 0 | bit 1 | bit 2 | bit 3 | bit 4 |
|---|---|---|---|---|---|
| | $A_0 = 1.00$ | $A_1 = 0.97$ | $A_2 = 0.95$ | $A_3 = 0.93$ | $A_4 = 0.91$ |
| | $B_0 = 1.00$ | $B_1 = 0.87$ | $B_2 = 0.70$ | $B_3 = 0.58$ | $B_4 = 0.48$ |

Total Gate Periphery: 143 mm

(56) References Cited

U.S. PATENT DOCUMENTS

| | | |
|---|---|---|
| 4,053,916 A | 10/1977 | Cricchi et al. |
| 4,244,000 A | 1/1981 | Ueda et al. |
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,849,651 A | 7/1989 | Estes, Jr. |
| 4,890,077 A | 12/1989 | Sun |
| 4,891,609 A | 1/1990 | Eilley |
| 4,893,070 A | 1/1990 | Milberger et al. |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,124,762 A | 6/1992 | Childs et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,345,422 A | 9/1994 | Redwine |
| 5,350,957 A | 9/1994 | Cooper et al. |
| 5,375,257 A | 12/1994 | Lampen |
| 5,405,795 A | 4/1995 | Beyer et al. |
| 5,416,043 A | 5/1995 | Burgener et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,784,687 A | 7/1998 | Itoh et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,013,958 A | 1/2000 | Aytur |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |

(56) References Cited

U.S. PATENT DOCUMENTS

| | | |
|---|---|---|
| 6,122,185 A | 9/2000 | Utsunomiya et al. |
| 6,133,752 A | 10/2000 | Kawagoe |
| 6,160,292 A | 12/2000 | Flaker et al. |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shimo |
| 6,195,307 B1 | 2/2001 | Umezawa et al. |
| 6,201,761 B1 | 3/2001 | Wollesen |
| RE37,124 E | 4/2001 | Monk et al. |
| 6,215,360 B1 | 4/2001 | Callaway, Jr. |
| 6,218,248 B1 | 4/2001 | Hwang et al. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,320,225 B1 | 11/2001 | Hargrove et al. |
| 6,337,594 B1 | 1/2002 | Hwang |
| 6,341,087 B1 | 1/2002 | Kunikiyo |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Sakai et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,414,863 B1 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,531,356 B1 | 3/2003 | Hayashi |
| 6,537,861 B1 | 3/2003 | Kroell et al. |
| 6,559,689 B1 | 5/2003 | Clark |
| 6,563,366 B1 | 5/2003 | Kohama |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,677,641 B2 | 1/2004 | Kocon |
| 6,677,803 B1 | 1/2004 | Chiba |
| 6,683,499 B2 | 1/2004 | Lautzenhiser et al. |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,703,863 B2 | 3/2004 | Gion |
| 6,711,397 B1 | 3/2004 | Petrov et al. |
| 6,714,065 B2 | 3/2004 | Komiya et al. |
| 6,717,458 B1 | 4/2004 | Potanin |
| 6,747,522 B2 | 6/2004 | Pietruszynski et al. |
| 6,753,738 B1 | 6/2004 | Baird |
| 6,762,477 B2 | 7/2004 | Kunikiyo |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,889,036 B2 | 5/2005 | Ballweber et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,906,653 B2 | 6/2005 | Uno |
| 6,908,832 B2 | 6/2005 | Farrens et al. |
| 6,917,258 B2 | 7/2005 | Kushitani et al. |
| 6,933,744 B2 | 8/2005 | Das et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 6,992,543 B2 | 1/2006 | Luetzelschwab et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,190,933 B2 | 3/2007 | De Ruijter et al. |
| 7,199,635 B2 | 4/2007 | Nakatsuka et al. |
| 7,212,788 B2 | 5/2007 | Weber et al. |
| 7,269,392 B2 | 9/2007 | Nakajima et al. |
| 7,299,018 B2 | 11/2007 | Van Rumpt |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe et al. |
| 7,405,982 B1 | 7/2008 | Flaker et al. |
| 7,432,552 B2 | 10/2008 | Park |
| 7,460,852 B2 | 12/2008 | Burgener et al. |
| 7,515,882 B2 | 4/2009 | Kelcourse et al. |
| 7,518,458 B2 | 4/2009 | Nakamura et al. |
| 7,546,089 B2 | 6/2009 | Bellantoni |
| 7,554,789 B2 | 6/2009 | Chen |
| 7,561,853 B2 | 7/2009 | Miyazawa |
| 7,616,482 B2 | 11/2009 | Prall |
| 7,659,152 B2 | 2/2010 | Gonzalez et al. |
| 7,714,676 B2 | 5/2010 | McKinzie |
| 7,733,156 B2 | 6/2010 | Brederlow et al. |
| 7,733,157 B2 | 6/2010 | Brederlow et al. |

(56) References Cited

U.S. PATENT DOCUMENTS

| | | | |
|---|---|---|---|
| 7,741,869 B2 | 6/2010 | Hidaka | |
| 7,796,969 B2 | 9/2010 | Kelly et al. | |
| 7,825,715 B1* | 11/2010 | Greenberg | 327/337 |
| 7,860,499 B2 | 12/2010 | Burgener et al. | |
| 7,910,993 B2 | 3/2011 | Brindle et al. | |
| 7,928,759 B2 | 4/2011 | Hidaka | |
| 7,960,772 B2 | 6/2011 | Englekirk | |
| 7,982,265 B2 | 7/2011 | Challa et al. | |
| 8,138,816 B2* | 3/2012 | Freeston et al. | 327/337 |
| 8,536,636 B2 | 9/2013 | Englekirk | |
| 8,583,111 B2 | 11/2013 | Burgener et al. | |
| 8,604,864 B2 | 12/2013 | Ranta et al. | |
| 8,638,159 B2 | 1/2014 | Ranta et al. | |
| 8,669,804 B2 | 3/2014 | Ranta et al. | |
| 8,803,631 B2* | 8/2014 | Manssen et al. | 333/32 |
| 9,024,700 B2 | 5/2015 | Ranta | |
| 9,106,227 B2 | 8/2015 | Ranta et al. | |
| 9,197,194 B2 | 11/2015 | Reedy et al. | |
| 2001/0015461 A1 | 8/2001 | Ebina | |
| 2001/0031518 A1 | 10/2001 | Kim et al. | |
| 2001/0040479 A1 | 11/2001 | Zhang | |
| 2001/0045602 A1 | 11/2001 | Maeda et al. | |
| 2002/0115244 A1 | 8/2002 | Park et al. | |
| 2002/0195623 A1 | 12/2002 | Horiuchi et al. | |
| 2003/0002452 A1 | 1/2003 | Sahota | |
| 2003/0141543 A1 | 7/2003 | Bryant et al. | |
| 2003/0181167 A1 | 9/2003 | Iida | |
| 2003/0201494 A1 | 10/2003 | Maeda et al. | |
| 2003/0205760 A1 | 11/2003 | Kawanaka et al. | |
| 2003/0222313 A1 | 12/2003 | Fechner | |
| 2004/0061130 A1 | 4/2004 | Morizuka | |
| 2004/0080364 A1 | 4/2004 | Sander et al. | |
| 2004/0129975 A1 | 7/2004 | Koh et al. | |
| 2004/0204013 A1 | 10/2004 | Ma et al. | |
| 2004/0242182 A1 | 12/2004 | Hidaka et al. | |
| 2005/0017789 A1 | 1/2005 | Burgener et al. | |
| 2005/0068103 A1 | 3/2005 | Dupuis et al. | |
| 2005/0077564 A1 | 4/2005 | Forbes | |
| 2005/0079829 A1 | 4/2005 | Ogawa et al. | |
| 2005/0121699 A1 | 6/2005 | Chen et al. | |
| 2005/0127442 A1 | 6/2005 | Veeraraghavan et al. | |
| 2005/0167751 A1 | 8/2005 | Nakajima et al. | |
| 2005/0285684 A1 | 12/2005 | Burgener et al. | |
| 2005/0287976 A1 | 12/2005 | Burgener et al. | |
| 2006/0009164 A1 | 1/2006 | Kataoka | |
| 2006/0077082 A1 | 4/2006 | Shanks et al. | |
| 2006/0160520 A1 | 7/2006 | Miyazawa | |
| 2006/0194558 A1 | 8/2006 | Kelly | |
| 2006/0194567 A1 | 8/2006 | Kelly et al. | |
| 2006/0270367 A1 | 11/2006 | Burgener et al. | |
| 2007/0018247 A1 | 1/2007 | Brindle et al. | |
| 2007/0023833 A1 | 2/2007 | Okhonin et al. | |
| 2007/0045697 A1 | 3/2007 | Cheng et al. | |
| 2007/0279120 A1 | 12/2007 | Brederlow et al. | |
| 2008/0073719 A1 | 3/2008 | Fazan et al. | |
| 2008/0076371 A1 | 3/2008 | Dribinsky et al. | |
| 2008/0106349 A1 | 5/2008 | McKinzie | |
| 2008/0265978 A1 | 10/2008 | Englekirk | |
| 2008/0303080 A1 | 12/2008 | Bhattacharyya | |
| 2009/0029511 A1 | 1/2009 | Wu | |
| 2009/0224843 A1 | 9/2009 | Radoias et al. | |
| 2011/0002080 A1 | 1/2011 | Ranta | |
| 2011/0163779 A1 | 7/2011 | Hidaka | |
| 2011/0227666 A1 | 9/2011 | Manssen et al. | |
| 2013/0222075 A1 | 8/2013 | Reedy et al. | |
| 2014/0165385 A1 | 6/2014 | Englekirk et al. | |

FOREIGN PATENT DOCUMENTS

| | | |
|---|---|---|
| EP | 385641 | 9/1990 |
| EP | 0622901 | 11/1994 |
| EP | 782267 | 7/1997 |
| EP | 913939 | 5/1999 |
| EP | 625831 | 11/1999 |
| EP | 1006584 | 7/2000 |
| EP | 2568608 A1 | 3/2013 |
| EP | 2760136 | 7/2014 |
| JP | 55-75348 | 6/1980 |
| JP | S63-164352 | 7/1988 |
| JP | 1254014 | 10/1989 |
| JP | 2161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | 06-334506 | 12/1994 |
| JP | 6334506 | 12/1994 |
| JP | 7046109 | 2/1995 |
| JP | 07-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | 08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 09163721 | 6/1997 |
| JP | 9163721 | 6/1997 |
| JP | 09-200021 | 7/1997 |
| JP | 9181641 | 7/1997 |
| JP | 9186501 | 7/1997 |
| JP | 09200021 | 7/1997 |
| JP | 9200074 | 7/1997 |
| JP | 9238059 | 9/1997 |
| JP | 9243738 | 9/1997 |
| JP | 09-008621 | 10/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 2001157487 | 5/2001 |
| JP | 2001156182 | 6/2001 |
| JP | 2001-510006 | 7/2001 |
| JP | 2001274265 | 10/2001 |
| JP | 2002-033660 | 1/2002 |
| JP | 2002-098712 | 4/2002 |
| JP | 2004515937 | 5/2002 |
| JP | 2000358775 | 6/2002 |
| JP | 2003060451 | 2/2003 |
| JP | 2003101407 | 4/2003 |

(56) References Cited

FOREIGN PATENT DOCUMENTS

| | | |
|---|---|---|
| JP | 2003-516083 | 5/2003 |
| JP | 2003143004 | 5/2003 |
| JP | 2003167615 | 6/2003 |
| JP | 2003189248 | 7/2003 |
| JP | 2003332583 | 11/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-203643 | 7/2005 |
| JP | 5591356 | 8/2014 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO99/49565 | 9/1999 |
| WO | WO01/41306 | 6/2001 |
| WO | WO0227920 | 4/2002 |
| WO | WO2006038190 | 4/2006 |
| WO | WO2007033045 A2 | 3/2007 |
| WO | WO-2008/133621 | 11/2008 |
| WO | 2009108391 | 9/2009 |
| WO | WO-2009/108391 | 9/2009 |

OTHER PUBLICATIONS

Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science+Business Media, 2000.
Brinkman, et al., Respondents' Notice of Prior Art, Investigation No. 337-TA-848, dated Aug. 31, 2012, 59 pgs.
Gonzalez, Brosa A., Decision to Grant a European Patent Pursuant to Article 97(1) EPC received from the EPO dated Nov. 2, 2012 for related appln. No. 09715932.1, 1 pg.
Simon, Volker, Communication Pursuant to Article 94(3) EPC received from the EPO dated Nov. 16, 2012 for related appln. No. 09174085.2, 8 pgs.
Le, Dinh Thanh, Office Action received from the USPTO dated Nov. 20, 2012 for related U.S. Appl. No. 12/803,064, 6 pgs.
Patel, Reema, Notice of Allowance received from the USPTO dated Dec. 3, 2012 for related U.S. Appl. No. 13/046,560, 9 pgs.
Japanese Patent Office, Notice of Allowance received from the Japanese Patent Office dated Dec. 17, 2012 for related appln. No. 2010-506156, 3 pgs.
Dang, Hung, Notice of Allowance received from the USPTO dated Oct. 1, 2012 for related U.S. Appl. No. 12/735,954, 67 pgs.
Nguyen, Niki Hoang, Office Action received from the USPTO dated Sep. 26, 2012 for related U.S. Appl. No. 13/277,108, 47 pgs.
Nishide, Ryuji, Translation of Japanese Office Action received from the JPO dated Jul. 17, 2012 for related appln. No. 2008-521544, 4 pgs.
Dang, Hung Q., Notice of Allowance received from the USPTO dated Jan. 25, 2013 for related U.S. Appl. No. 12/735,954, 42 pgs.
Rojas, Daniel E, Office Action received from USPTO on Feb. 21, 2013 for related U.S. Appl. No. 12/803,139, 7 pgs.
Le, Dinh Thanh, Notice of Allowance received from USPTO on Mar. 4, 2013 for related U.S. Appl. No. 12/803,064, pp. 6.
Ranta, et al., Second Response After Final filed in the USPTO on Feb. 20, 2013 for related U.S. Appl. No. 12/803,064, 9 pgs.
Patel, Reema, Notice of Allowance received from USPTO on Mar. 15, 2013 for related U.S. Appl. No. 13/046,560, 10 pgs.
Ranta, et al., Response After Final filed in the USPTO dated Jan. 22, 2013 for related U.S. Appl. No. 12/803,064, 7 pgs.
Brosa, Anna-Maria, European Search Report received from the EPO dated Feb. 1, 2013 for related appln. No. EP12194187, 10 pgs.
Lauterbach, et al., "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Dang, Hung Q., Notice of Allowance received from the USPTO dated May 10, 2013 for related U.S. Appl. No. 12/735,954, 22 pgs.
Ranta, et al., Response filed in USPTO dated May 20, 2013 for related U.S. Appl. No. 12/803,139, 8 pgs.
Peregrine Semiconductor Corporation, Response filed in EPO dated May 23, 2013 for related appln. No. 09174085.2, 16 pgs.
Utagawa, Tsutomu, Office Action received from the JPO dated Jun. 4, 2013 for related appln. No. 2010-548750, 3 pgs.
Englekirk, Robert Mark, Part B—Fee(s) Transmittal and Comments on Examiner's Statement of Reasons for Allowance filed in USPTO dated Jun. 17, 2013 for related U.S. Appl. No. 13/046,560, 4 pgs.
Rojas, Daniel E., Office Action received from USPTO dated Jun. 17, 2013 for related U.S. Appl. No. 12/803,139, 36 pgs.
Le, Dinh Thanh, Notice of Allowance received from the USPTO dated Jul. 18, 2013 for related U.S. Appl. No. 12/803,064, 12 pgs.
Cole, Brandon S., Notice of Allowance received from the USPTO dated Jul. 30, 2013 for related U.S. Appl. No. 12/803,133, 136 pgs.
Dang, Hung, Notice of Allowance received from the USPTO dated Sep. 13, 2013 for related U.S. Appl. No. 12/735,954, 16 pgs.
Burgener, et al., Amendment filed in the USPTO dated Aug. 19, 2013 for related U.S. Appl. No. 12/980,161, 20 pgs.
Peregrine Semiconductor Corporation, Response filed in the JPO dated Sep. 4, 2013 for related appln. No. 2010-548750, 11 pgs.
Peregrine Semiconductor Corporation, Response filed in the EPO dated Sep. 11, 2013 for related appln. No. 1219418.6, 16 pgs.
Ranta, et al., Response filed in the USPTO dated Sep. 17, 2013 for related U.S. Appl. No. 12/803,139, 14 pgs.
Rojas, Daniel, Notice of Allowance received from the USPTO dated Oct. 22, 2013 for related U.S. Appl. No. 12/803,139, 142 pgs.
Volker, Simon, Communication Pursuant to Article 94(3) EPC received from the EPO dated Sep. 24, 2013 for related appln. No. 07794407.2, 5 pgs.
Geynet, et al., "Fully-Integrated Mutli-Standard VCO with Switched LC Tank and Power Controlled by Body Voltage in SOI", RFIC, San Francisco, Jun. 11-13, 2006, 24 pgs.
Geynet, et al., "Fully-Integrated Mutli-Standard VCOs with switched LC tank and Power Controlled by Body Voltage in 130nm CMOS/SOI", CEA-Leti, France, 2006, 4 pgs.
Lai, et al. "A 5GHz CMOS Low Phase Noise Transformer Power Combining VCO", RFIC, 2006, U.C. Santa Barbara, California, 17 pgs.
Lai, et al. "A 5GHz CMOS Low Phase Noise Transformer Power Combining VCO", 2006, Dept. of Electrical and Computer Engineering, U.C. Santa Barbara, California, 4 pgs.
Funakoshi, Ryo, Office Action and English translation received from the JPO dated Oct. 29, 2013 for related appln. No. 2013-006365, 15 pgs.
European Patent Office, Communication under Rule 71(3) EPC received from the EPO dated Nov. 12, 2013 for related appln. No. 12194187.6, 94 pgs.
Japanese Patent Office, Certificate of Grant received from the JPO dated Nov. 22, 2013 for related appln. No. 2010-548750, 2 pgs.
Dang, Hung, Office Action received from the USPTO dated Feb. 26, 2014 for related U.S. Appl. No. 12/735,954, 34 pgs.
Gonzalez, Brosa, Decision to grant a European patent pursuant to Article 97(1) EPC received from the EPO dated Apr. 17, 2014 for related appln. No. 12194187.6, 1 pgs.
Peregrine Semiconductor Corporation, Response and English translation that was filed in the JPO dated Apr. 28, 2014 for related appln. No. 2013-006353, 22 pgs.
European Patent Office, Noting of Loss of Rights pursuant to Rule 112(1) EPC received from the EPO dated May 2, 2014 for related appln. No. 07794407.2, 1 pgs.
Brosa, Anna-Maria, Extended Search Report received from the EPO dated May 27, 2014 for related appln. No. 14165804.7, 8 pgs.

(56) References Cited

OTHER PUBLICATIONS

Ranta, Tero, Amendment filed in the USPTO dated Jun. 26, 2014 for related U.S. Appl. No. 12/735,954, 33 pgs.
Japanese Patent Office, Notice of Allowance received from the JPO dated Jul. 8, 2014 for related appln. No. 2013-006353, 3 pgs.
Peregrine Semiconductor Corporation, Response filed in the EPO dated Jul. 11, 2014 for related appln. No. 07794407.2, 32 pgs.
European Patent Office, Communication pursuant to Rule 58 EPC received from the EPO dated Jul. 21, 2014 for related appln. No. 07794407.2, 5 pgs.
Peregrine Semiconductor Corporation, Response filed in the EPO dated Jul. 30, 2014 for related appln. No. 07794407.2, 25 pgs.
Rojas, Daniel, Office Action received from the USPTO dated Aug. 12, 2014 for related U.S. Appl. No. 14/178,116, 9 pgs.
Patel, Reema, Office Action received from the USPTO dated Aug. 15, 2014 for related U.S. Appl. No. 14/028,357, 8 pgs.
Wong, Alan, Office Action received from the USPTO dated Sep. 12, 2014 for related U.S. Appl. No. 13/595,893, 11 pgs.
NEC Corporation, "uPG13xG Series L-Band SPDT Switch GaAs MMIC", Document No. P1096EJ1VOANDO (1st Edition), Feb. 1996, 30 pgs.
Pozar, "Microwave and RF Design of Wireless Systems", Wiley, 2001.
Maas, "The RF and Microwave Circuit Design Cookbook", Artech House, 1998.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System Design for Telecommunications", Wiley, 1997.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
Fuse, et al., "A 0.5V 200MHz 1-Stage 32b ALU Using a Body Bias Controlled SOI Pass-Gate Logic", IEEE Int'l Solid-State Circuits Conference, Feb. 1997.
Douseki, et al., "A 0.5-V MTCMOS/SIMOX Logic Gate", IEEE Journal of Solid-State Circuits, vol. 32, No. 10, Oct. 1997.
Douseki, et al., "A 0.5v SIMOX-MTMCOS Circuit with 200ps Logic Gate", IEEE Int'l Solid-State Circuits Conference, 1996, pp. 84-85, 423.
Shimomura, et al., "A 1-V 46-ns 16-mb SOI-DRAM with Body Control Technique", IEEE Journal of Solid-State Circuits, vol. 32, No. 11, Nov. 1997, pp. 1712-1720.
Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.
Workman, et al., "A Comparative Analysis of the Dynamic Behavior of BTG/SOI MOSFETs and Circuits with Distributed Body Resistance", IEEE Transactions on Electron Devices, vol. 45, No. 10, Oct. 1998, pp. 2138-2145.
Kuang, et al., "A Dynamic Body Discharge Technique for SOI Circuit Applications", IEEE Int'l SOI Conference, Oct. 1999, pp. 77-78.
Assaderaghi, et al., "A Dynamic Threshold Voltage MOSFET (DTMOS) for Ultra-Low Voltage Operation", Int'l Electron Devices Meeting, Dec. 1994, pp. 809-812.
Kuang, et al., "A Floating-Body Charge Monitoring Technique for Partially Depleted SOI Technology", Int'l Journal of Electronics, vol. 91, No. 11, Nov. 2004, pp. 625-637.
Gil, et al., "A High Speed and Low Power SOI Inverter Using Active Body-Bias", Proceedings Int'l Symposium on Low Power Electronics and Design, Aug. 1998, pp. 59-63.
Gil, et al., "A High Speed and Low Power SOI Inverter Using Active Body-Bias", Solid-State Electronics, vol. 43, 1999, pp. 791-799.
Kuang, et al., "A High-Performance Body-Charge-Modulated SOI Sense Amplifier", IEEE Int'l SOI Conference, Oct. 2000, pp. 100-101.
Tinella, et al., "A High-Performance CMOS-SOI Antenna Switch for the 2.5 5GHz Band", IEEE Journal of Solid-State Circuits, vol. 38, No. 7, Jul. 2003, All pgs.
Chung, et al., "A New SOI Inverter for Low Power Applications", IEEE SOI Conference, Oct. 1996, pp. 20-21.
Chung, et al., "A New SOI Inverter Using Dynamic Threshold for Low-Power Applications", IEEE Electron Device Letters, vol. 18, No. 6, Jun. 1997, pp. 248-250.
Chung, et al., "A New SOI MOSFET Structure with Junction Type Body Contact", Int'l Electron Device Meeting (IEDM) Technical Digest, 1999, pp. 59-62.
Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.
Wang, et all., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.
Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.
Hu, et al., "A Unified Gate Oxide Reliability Model", IEEE 37th Annual Int'l Reliability Physics Symposium, 1999, pp. 47-51, San Diego, California.
Nakatani, "A Wide Dynamic Range Switched-LNA in SiGe BICMOS", IEEE Radio Frequency Integrated Circuits Symposium, 2001, pp. 223-226.
Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pgs. All.
Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.
Wada, et al., "Active Body-Bias SOI-CMOS Driver Circuits", Symposium on VLSI Circuits Digest of Technical Papers, 1997, pp. 29-30.
Stuber, et al., Amendment filed in the USPTO dated Jun. 10, 2010 for related U.S. Appl. No. 11/520,912, 28 pgs.
Saccamango, et al., "An SOI Floating Body Charge Monitor Technique", IEEE Int'l SOI Conference, Oct. 2000, pp. 88-89.
Lee, et al., "Analysis of Body Bias Effect with PD-SOI or Analog and RF Applications", Solid State Electron, vol. 46, 2002, pp. 1169-1176.
Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.

(56) References Cited

OTHER PUBLICATIONS

Gautier, et al., "Body Charge Related Transient Effects in Floating Body SOI NMOSEETs", IEDM Tech. Digest, 1995, pp. 623-626.
Koh, et al., "Body-Contracted SOI MOSFET Structure and its Application to DRAM", IEEE Transactions on Electron Devices, vol. 45, No. 5, May 1998, pp. 1063-1070.
Koh, et al., "Body-Contacted SOI MOSFET Structure with Fully Bulk CMOS Compatible Layout and Process", IEEE Electron Device Letters, vol. 18, No. 3, Mar. 1997, pp. 102-104.
Tseng, et al., "Characterization of Floating Body and Body-Grounded Thin Film Silicon-on-Insulator MOSFETs for Analog Circuit Applications", Ph.D. Thesis, UCLA, 1999, pgs. All.
Madihian, et al., "CMOS RF ICs for 900MHz-2.4GHz Band Wireless Communication Networks", IEEE Radio Frequency Integrated Circuits Symposium, 1999, pp. 13-16.
Orndorff, et al., "CMOS/SOS/LSI Switching Regulator Control Device", IEEE Int'l Solid-State Circuits Conference, ISSCC 78, Feb. 1978, pp. 234-235, 282.
Eschenbach, Communication from the EPO dated Feb. 4, 2009 for related appln. No. 06786943.8, 101 pgs.
Shingleton, Communication from the USPTO dated Apr. 28, 2009 for related U.S. Appl. No. 11/881,816, 3 pgs.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IEEE, 2000, pp. 6.4.1-6A.4.
Bolam, et al., "Reliability Issues for Silicon-on-Insulator", IBM Micro Electronics Division, IEEE 2000, pp. 6.4.1-6.4.4.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Giffard, et al., "Dynamic Effects in SOI MOSFETs", IEEE SOS/SOI Technology Conference, Oct. 1991, pp. 160-161.
Hirano, et al., "Impact of Actively Body-Bias Controlled (ABC) SOI SRAM by Using Direct Body Contact Technology for Low-Voltage Applications", IEEE, 2003, pp. 2.4.1-2.4.4.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al., "Effect of Body Structure on Analog Performance of SOI NMOSFETs", 1998 IEEE International SOI Conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/ local) GaAs SPDT Switch IC Operating at +3V/0V", Microwave Symposium Digest, 1996, pp. 141-144.
Uda, et al., "High Performance GaAs Switch IC's Fabricated Using MESFETs with Two Kinds of Pinch Off Voltages and a Symmetrical Pattern Configuration", IEEE Journal of Solid-State Circuits, 1994, pp. 1262-1269.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.

(56) References Cited

OTHER PUBLICATIONS

Koh, et al., "Low-Voltage SOI CMOS VLSI Devices and Circuits", Wiley Interscience, XP001090589, New York, 2001, pp. 57-60, 349-354.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Copenheaver, Brian, International Search Report and Written Opinion for related appln. No. PCT/US2009/001358 dated May 27, 2009, 11 pages.
Peregrine Semiconductor Corporation, Article 19 Amendment Letter Under Section 205(b) and Rule 46.5 (b) PCT filed in WIPO for related appln. No. PCT/US2009/001358, dated Aug. 11, 2009, 12 pages.
Kao, W.H., et al., "Parasitic extraction: current state of the art and future trends", Proceedings of the IEEE, May 2001, vol. 89, Issue 5, pp. 729-739.
Brambilla, A., et al., "Measurements and extractions of parasitic capacitances in ULSI layouts", Electron Devices, IEEE Transactions, Nov. 2003, vol. 50, Issue 11, pp. 2236-2247.
Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.
Nabors, et al., "FastCap: A Multipole Accelerated 3-D Capacitance Extraction Program", IEEE Transactions on Computer-Aided Design, vol. 10, No. 11, Nov. 1991, pp. 1447-1459.
Nabors, et al., "Fast Capacitance Extraction of General Three-Dimensional Structures", IEEE Transactions on Microwave Theory and Techniques, vol. 40, No. 7, Jul. 1992, pp. 1496-1506.
Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.
Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.
Nabors, et al., "A Fast Multipole Algorithm for Capacitance Extraction of Complex 3-D Geometries", IEEE 1989 Custom Integrated Circuits Conference, May 1989, pp. 21.7.1-21.7.4.
Nabors, et al., "Fast Capacitance Extraction of General Three-Dimensional Structures", Proc. Int. Conf. on Computer Design, Cambridge, MA, Oct. 1991, pp. 479-484.
Nabors, et al., "Including Conformal Dielectrics in Multipole-Accelerated Three-Dimensional Interconnect Capacitance Extraction", proceedings of Nupad IV, Seattle, WA, May 1992, 2 pgs.
Nabors, et al. "Multipole-Accelerated 3-D Capacitance Extraction Algorithms for Structures with Conformal Dielectrics", Proceeding of the 29th Design Automation Conference, Anaheim, CA, Jun. 1992, pp. 710-715.
Phillips, et al., "A Precorrected-FFT method for Capacitance Extraction of Complicated 3-D Structures", Int. Conf. On Computer-Aided Design, Santa Clara, CA, Nov. 1994, 4 pgs.
Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.
Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.
Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.
Young, Lee W., International Search Report received from USRO for related appln. No. PCT/US2007/10331 dated Feb. 15, 2008, 14 pages.
Englekirk, Robert, Preliminary Amendment filed in the USPTO dated Sep. 11, 2009 for related U.S. Appl. No. 11/796,522, 9 pgs.
Patel, Reema, Office Action received from the USPTO dated Oct. 2, 2009 for related U.S. Appl. No. 11/796,522, 6 pgs.
Englekirk, Robert, Response filed in the USPTO dated Nov. 2, 2009 for related U.S. Appl. No. 11/796,522, 3 pgs.
Shifrin, M., "Monolithic FET Structures for High-Power Control Components Applications", IEEE Transactions on Microwave Theory and Techniques, IEEE Service Center, Piscataway, NJ, US., vol. 37, No. 12, Dec. 1, 1989, pp. 2134-2141.
Shifrin, M., et al., "High Power Control Components using a New Monolithic Fet Structure", Jun. 12-13, 1989, pp. 51-56, XP010087279.
Volker, Simon, Communication from the EPO dated Dec. 3, 2009 for related appln. No. 09174085.2-1233, 6 pgs.
European Patent Office, Communication Pursuant to Rules 161 and 162 EPC dated Dec. 10, 2009 for related appln. No. 07794407.2, 2 pgs.
Volker, Simon, European Search Report received from the EPO dated Mar. 12, 2010 for related appln. 07794407.2, 8 pgs.
Patel, Reema, Office Action received from the USPTO dated Mar. 2, 2010 for related U.S. Appl. No. 11/796,522, 8 pgs.
Englekirk, Robert, Amendment filed in the USPTO dated Jun. 2, 2010 for related U.S. Appl. No. 11/796,522, 10 pgs.
Volker, Simon, Communication Pursuant to Article 94(3) EPC received from the EPO dated May 4, 2010 for related appln. No. 09174085.2, 1 pgs.
Volker, Simon, Communication Pursuant to Article 94(3) EPC received from the EPO dated Jun. 15, 2010 for related appln. No. 07794407.2, 1 pgs.
Peregrine Semiconductor Corporation, Response filed in the EPO for related appln. No. 07794407.2 dated Oct. 20, 2010, 13 pgs.
Peregrine Semiconductor Corporation, Response filed in the EPO for related appln. No. 09174085.2 dated Oct. 20, 2010, 14 pgs.
Patel, Reema, Office Action received from the USPTO dated Aug. 30, 2010 for related U.S. Appl. No. 11/796,522, 15 pgs.
Englekirk, Robert, Response filed in the USPTO dated Dec. 30, 2010 for related U.S. Appl. No. 11/796,522, 17 pgs.
Novak, Rodd, "Overcoming the RF Challenges of Multiband Mobile Handset Design", RF/Microwave Switches and Connectors, published Jul. 20, 2007, www.rfdesign.com, 3 pgs.
Qiao, et al., "Antenna Impedance Mismatch Measurement and Correction for Adaptive CDMA Transceivers", published Jun. 12-17, 2005, by the IEEE in the 2005 Microwave Symposium Digest, 2005 IEEE MTT-S International, pp. 4, et seq.
Sjoblom, Peter, "An Adaptive Impedance Tuning CMOS Circuit for ISM 2.4-GHz Band", published in the IEEE Transactions on Circuits and Systems—1: Regular Papers, vol. 52, No. 6, pp. 1115-1124, Jun. 2005.
Sjoblom, Peter, "Measured CMOS Switched High-Quality Capacitors in a Reconfigurable Matching Network", IEEE Transactions on Circuits and Systems—II: Express Briefs, vol. 54, No. 10, Oct. 2007, pp. 858-862.
Patel, Reema, Notice of Allowance received from the USPTO dated Jan. 28, 2011 for related U.S. Appl. No. 11/796,522, 9 pgs.
Le, Dinh Thanh, Office Action received from the USPTO dated Jun. 23, 2011 for related U.S. Appl. No. 12/803,064, 16 pgs.
Brosa, Anna-Maria, extended European Search Report received from the EPO dated Jul. 15, 2011 for related application No. 09715932.1, 12 pgs.
Dang, Hung Q., Office Action received from the USPTO dated Dec. 22, 2011 for related U.S. Appl. No. 12/735,954, 32 pgs.
Peregrine Semiconductor Corporation, Response filed in the EPO dated Feb. 10, 2012 for related appln. No. 09715932.1, 47 pgs.
Cole, Brandon S., Office Action received from the USPTO dated Feb. 24, 2012 for related U.S. Appl. No. 12/803,133, 36 pgs.

(56) References Cited

OTHER PUBLICATIONS

Ranta, Tero Tapio, Amendment filed in the USPTO dated Mar. 21, 2012 for related U.S. Appl. No. 12/735,954, 16 pgs.
Kurisu, Masakazu, Japanese Office Action and translation received from the JPO dated Apr. 17, 2012 for related appln. No. 2010-506156, 4 pgs.
Ranta, et al., Amendment filed in USPTO dated Apr. 30, 2012 for related U.S. Appl. No. 12/803,064, 16 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration No. H1435, published May 2, 1995.
Yamamoto, et al., "A Single-Chip GaAs RF Transceiver for 1.9GHz Digital Mobile Communication Systems", IEEE Journal of Solid-State Circuits, 1996.
Yamamoto, et al., "A Single-Chip GaAs RF Transceiver for 1.9GHz Digital Mobile Communication Systems", IEEE, 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz", IEEE Transactions on Electron Devices, 1997, pp. 1981-1989.
Hu, et al., "A Unified Gate Oxide Reliability Model", IEEE 37th Annual International Reliability Physic Symposium, 1999, pp. 47-51.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.
Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"CMOS SOI RF Switch Family", Honeywell, 2002, pp. 1-4.
"CMOS SOI Technology", Honeywell, 2001, pp. 1-7.
Burgener, "CMOS SOS Switches Offer Useful Features, High Integration", Microwaves & RF, 2001, pp. 107-118.
Analog Devices, "CMOS, Low Voltage RF/Video, SPST Switch", Analog Devices, inc., 1999, pp. 1-10.

Eggert, et al., "CMOS/SIMOX-RF-Frontend for 1.7GHz", Solid State Circuits Conference, 1996.
Orndorff, et al., CMOS/SOS/LSI Switching Regulator Control Device, IEEE International, vol. XXI, Feb. 1978, pp. 234-235.
Burgener, et al., Comments on Examiners Statements of Reasons for Allowance filed in the USPTO dated Aug. 2004 relating to U.S. Appl. No. 10/267,531.
Aquilani, Communication and supplementary European Search Report dated Nov. 2009 relating to appln. No. 05763216.
Van Der Peet, Communications pursuant to Article 94(3) EPC received from the EPO dated Jun. 2008 relating to appln. No. 02800982.7-2220.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.
Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Quality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.
Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Giffard, et al., "Dynamic Effects in SOI MOSFET's", 1991 IEEE SOS/SOI Technology Conference, pp. 160-161.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Assaderaghi, et al., "Dynamic Threshold-Voltage MOSFET (DTMOS) for Ultra-Low Voltage VLSI", IEEE Transactions on Electron, vol. 44, No. 3, Mar. 1997, pp. 414-422.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Lee, et al., "Effects of Gate Structure on the RF Performance in PD SOI MOSFETs", IEEE Microwave and Wireless Components Letters, vol. 15, No. 4, Apr. 2005.
Krishnan, "Efficacy of Body Ties Under Dynamic Switching Conditions in Partially Depleted SOI CMOS Technology", Proceedings IEEE Int'l SOI Conference, Oct. 1997, pp. 140-141.

(56) References Cited

OTHER PUBLICATIONS

Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Lee, et al., "Harmonic Distortion Due to Narrow Width Effects in Deep Submicron SOI-CMOS Device for Analog-RF Applications", IEEE Int'l SOI Conference, Oct. 2002, pp. 83-85.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Damiano, et al., "Integrated Dynamic Body Contact for H Gate PD SOI MOSFETs for High Performance/Low Power", IEEE SOI Conference, Oct. 2004, pp. 115-116.
Tat, International Search Report and Written Opinion received from USRO dated Jul. 3, 2008 for related appln. No. PCT/US06/36240.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.
Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.
Keys, "Low Distortion Mixers or RF Communications", Ph.D. Thesis, University of California-Berkeley, 1995.
Suehle, et al., "Low Electric Field Breakdown of Thin Si02 Films Under Static and Dynamic Stress", IEEE Transactions on Electron Devices, vol. 44, No. 5, May 1997.
Chen, et al., "Low Power, Multi-Gigabit DRAM Cell Design Issues Using SOI Technologies", http://bwrc.eecs.berkeley.edu/people/grad_students/chenff/reports, May 1999.
Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.
Wei, "Measurement and Modeling of Transient Effects in Partially Depleted SOI MOSFETs", M.S. Thesis, MIT, Jul. 1996.
Wei, et al., "Measurement of Transient Effects in SOI DRAM/SRAM Access Transistors", IEEE Electron Device Letters, vol. 17, No. 5, May 1996.
Shoucair, "Modeling, Decoupling and Supression of MOSFET Distortion Components", IEEE Proceeding Circuit Devices Systems, vol. 146, No. 1, Feb. 1999.
Tat, Notice of Allowance received from USPTO dated Sep. 16, 2010 for related U.S. Appl. No. 11/520,912.
Shingleton, Office Action received from USPTO dated Oct. 7, 2008 for related U.S. Appl. No. 11/881,816.
Tat, Office Action received from USPTO dated Dec. 10, 2009 for related U.S. Appl. No. 11/520,912.
Shingleton, Office Action received from USPTO dated Jan. 19, 2010 for related U.S. Appl. No. 11/881,816.
Tat, Office Action received from USPTO dated Jul. 8, 2009 for related U.S. Appl. No. 11/520,912.
Tat, Office Action received from USPTO dated Sep. 15, 2008 for related U.S. Appl. No. 11/520,912.
Shahidi, et al., "Partially Depleted SOI Technology for Digital Logic", IEEE Int'l Solid-State Circuits Conference, 1999, pp. 426-427.
Stuber, et al., Photocopy of an amendment that was filed with the USPTO dated Mar. 16, 2009 for related U.S. Appl. No. 11/520,912.
Stuber, et al., Photocopy of an amendment that was filed with the USPTO dated Sep. 8, 2009 for related U.S. Appl. No. 11/520,912.
Photocopy of a translation of an Office Action dated Jul. 31, 2009 for related Chinese appln. No. 200680025128.7.
Hameau, et al., "Radio-Frequency Circuits in Integration Using CMOS SOI 0.25um Technology", 2002 RF IC Design Workshop Europe, Mar. 2002, Grenoble, France.
Dribinsky, Response file in USPTO date Aug. 28, 2009 to related U.S. Appl. No. 11/881,816.
Matloubian, "Smart Body Contact for SOI MOSFETs", 1989 IEEE SOS/SOI Technology Conference, Oct. 1999, pp. 128-129.
Chuang, et al., "SOI for Digital CMOS VLSI Design: Design Consideration and Advances", Proceedings of the IEEE, vol. 86, No. 4, Apr. 1998, pp. 689-720.
Chung, et al., "SOI MOSFET Structure with a Junction Type Body Contact for Suppression of Pass Gate Leakage", IEEE Transactions on Elelctron Devices, vol. 48, No. 7, Jul. 2001.
Rozeau, et al., "SOI Technologies Overview for Low-Power Low-Voltage Radio-Frequency Aplications", Analog Integrated Circuits and Signal Processing, 25, Kluwer Academic Publishers, Nov. 2000, pp. 93-114.
Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.
Kuang, et al., "SRAM Bitline Circuits on PD SOI: Advantages and Concerns", IEEE Journal of Solid-State Circuits, vol. 32, No. 6, Jul. 1997.
Maeda, et al., "Substrate-Bias Effect and Source-Drain Breakdown Characteristics in Body-Tied Short-Channel SOI MOSFET's", IEEE Transactions on Electron Devices, vol. 46, No. 1, Jan. 1999, pp. 151-158.
Morena, Supplementary European Search Report dated Feb. 17, 2010 relating to appln. No. 06814836.0.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State Circuits Conference, Feb. 1997.
Sleight, et al., "Transient Measurements of SOI Body Contact Effectiveness", IEEE Electron Device Letters, vol. 19, No. 12, Dec. 1998.
Assaderaghi, et al, "Transient Pass-Transistor Leakage Current in SOI MOSFET's", IEEE Electron Device Letters, vol. 18, No. 6, Jun. 1997, pp. 241-243.
Brindle, et al., Translation of a response filed with the Chinese Patent Office dated Nov. 30, 2009 relating to appln. No. 200680025128.7.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", 1996 IEEE Int'l Solid-State Circuits Conference, Feb. 1996, pp. 88-89,424.
Brindle, et al., Response filed in the EPO for related appln. No. 06814836.0-1235 dated Oct. 12, 2010.
Ranta, et al., Response filed in the USPTO dated May 23, 2012 for related U.S. Appl. No. 12/803,133, 7 pgs.
Patel, Reema, Notice of Allowance received from the USPTO dated May 24, 2012 for related U.S. Appl. No. 13/046,560, 15 pgs.

(56) References Cited

OTHER PUBLICATIONS

Dang, Hung Q., Notice of Allowance received from the USPTO dated Jul. 12, 2012 for related U.S. Appl. No. 12/735,954, 20 pgs.
Le, Dinh Thanh, Office Action received from the USPTO dated Dec. 1, 2011 for related U.S. Appl. No. 12/803,064, 23 pgs.
Patel, Reema, Office Action received from the USPTO dated Dec. 5, 2011 for related U.S. Appl. No. 13/046,560, 13 pgs.
Englekirk, Robert Mark, Amendment filed in the USPTO dated Mar. 5, 2012 for related U.S. Appl. No. 13/046,560, 4 pgs.
Cole, Brandon S., Notice of Allowance received from the USPTO dated Jun. 8, 2012 for related U.S. Appl. No. 12/803,133, 12 pgs.
Le, Dinh Thanh, Office Action received from the USPTO dated Jun. 13, 2012 for related U.S. Appl. No. 12/803,064, 14 pgs.
Theunissen, Lars, Communication under Rule 71(3) EPC dated Jul. 2, 2012 for related appln. No. 09715932.1, 98 pgs.
Ranta, et al., Comments on Examiners Statement of Reasons for Allowance filed in the USPTO dated Sep. 10, 2012 for related U.S. Appl. No. 12/803,133, 3 pgs.
Ranta, et al., Amendment filed in the USPTO dated Sep. 12, 2012 for related U.S. Appl. No. 12/803,064, 13 pgs.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AIGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
Wei, et al., "Measuremenets of Transient Effects in SOI DRAM/SRAM Access Transistors", IEEE Electron Device Letters, vol. 17, No. 5, May 1996.
De La Houssaye, et al., "Microwave Performance of Optically Fabricated T-Gate Thin Film Silicon on Sapphire Based MOSFET's", IEEE Electron Device Letters, 1995, pp. 289-292.
Shifrin, et al., "Monolithic FET Structure for HighPower Control Component Applications", IEEE Transactions on Microwave Theory and Techniques, 1989, pp. 2134-2142.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Jun. 2006 relating to U.S. Appl. No. 10/922,135.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
McGrath, et al., "Novel High Performance SPDT Power Switches Using Multi-Gate FET's", IEEE, 1991, pp. 839-842.
Tieu, Office Action from the USPTO dated Nov. 2007 relating to U.S. Appl. No. 11/582,206.
Tieu, Office Action from the USPTO dated Jun. 2005 relating to U.S. Appl. No. 10/922,135.
Tieu, Notice of Allowance from the USPTO dated Jun. 2006 relating to U.S. Appl. No. 10/922,135.
Chow, Office Action from the USPTO dated Apr. 2010 relating to U.S. Appl. No. 11/347,671.
Tieu, Office Action from the USPTO dated Sep. 2009 relating to U.S. Appl. No. 11/347,014.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching Si-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
Kelly, Proposed Amendment After Final from the USPTO dated Jun. 2009 relating to U.S. Appl. No. 11/351,342.
"Radiation Hardened CMOS Dual DPST Analog Switch", Intersil, 1999, pp. 1-2.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Wang, et al., "Efficiency Improvement in Charge Pump Circuits", IEEE Journal of Solid-State Circuits, vol. 32, No. 6, Jun. 1997, pp. 852-860.
Minoli, "Telecommunications Technology Handbook", Artech House, 2003.
Morreale, "The CRC Handbook of Modern Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Willert-Porata, M, Advanced in Microwave and Radio Frequency Processing, 8th International Conference on Microwave and High-Frequency Heating, Oct. 2009.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.

(56) References Cited

OTHER PUBLICATIONS

Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Chung, et al., "SOI MOSFET Structure with a Junction Type Body Contact for Suppression of Pass Gate Leakage", IEEE Transactions on Electron Devices, vol. 48, No. 7, Jul. 2001.
Rozeau, "SOI Technologies Overview for Low Power Low Voltage Radio Frequency Applications", Analog Integrated Circuits and Signal Processing, Nov. 2000, pp. 93-114.
Fukuda, et al., "SOI CMOS Device Technology", Special Edition on 21st Century Solutions, 2001, pp. 54-57.
Fukuda, et al., "SOI CMOS Device Technology", OKI Technical Review, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "SPICE Modeling of Microwave and RF Control Diodes", IEEE, 2000, pp. 28-31.
Kuang, et al., "SRAM Bitline Circuits on PD SOI: Advantages and Concerns", IEEE Journal of Solid State Circuits, vol. 32, No. 6, Jun. 1997.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Karandikar, et al., "Technology Mapping for SOI Domino Logic Incorporating Solutions for the Parasitic Bipolar Effect", ACM, 2001, pp. 1-14.
Numata, et al., "A +2.4/0 V Controlled High Power GaAs SPDT Antenna Switch IC for GSM Application", IEEE Radio Frequency Integrated Circuits Symposium, 2002, pp. 141-144.
Huang, et al., "A 0.5-um CMOS T/R Switch for 900-MHz Wireless Applications", IEEE Journal of Solid-State Circuits, 2001, pp. 486-492.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip Si-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Workman, et al., "A Comparative Analysis of the Dynamic Behavior of BTG/SOI MOSFET's and Circuite with Distributed Body Resistance", IEEE Transactions and Electron Devices, vol. 45, No. 10, Oct. 1998, pp. 2138-2145.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Tinella, et al., "A High Performance CMOS-SOI Antenna Switch for the 2.5-5-GHz Band", IEEE Journal of Solid-State Circuits, 2003, pp. 1279-1283.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.

(56) References Cited

OTHER PUBLICATIONS

Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Kanda, et al., "A Si RF Switch MMIC for the Cellular Frequency Band Using SOI-CMOS Technology", The Institute of Electronics, Information and Communication Engineers, 2000, pp. 79-83.
Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Lee, et al., "Harmonic Distortion Due to Narrow Width Effects in Deep Submicron SOI-CMOS Device for Analog RF Applications", 2002 IEEE International SOI Conference, Oct. 2002.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.

De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to U.S. Appl. No. 10/267,531.
Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Megahed, et al., "Low Cost UTSi Technology for RF Wireless Applications", IEEE MTT-S Digest, 1998.
Ichikawa, Takenori, Office Action and English translation received from the JPO dated Nov. 18, 2014 for appln. No. 2013-181032, 15 pgs.
Ranta, et al., Response filed in the USPTO dated Nov. 12, 2014 for U.S. Appl. No. 14/178,116, 8 pgs.
Dang, Hung Q., Notice of Allowance received from the USPTO dated Nov. 18, 2014 for U.S. Appl. No. 12/735,954, 33 pgs.
Peregrine Semiconductor Corporation, Response filed in the EPO dated Dec. 10, 2014 for appln. No. 14165804.7, 76 pgs.
Reedy, et al., Response filed in the USPTO dated Dec. 21, 2014 for U.S. Appl. No. 13/595,893, 24 pgs.
Englekirk, Robert Mark, Response filed in the USPTO dated Dec. 15, 2014 for U.S. Appl. No. 14/028,357, 10 pgs.
Wong, Alan, Final Office Action received from the USPTO dated Mar. 4, 2015 for U.S. Appl. No. 13/595,893, 33 pgs.
Puentes, Daniel, Notice of Allowance received from the USPTO dated Mar. 31, 2015 for U.S. Appl. No. 14/178,116, 181 pgs.
Patel, Reema, Final Office Action received from the USPTO dated Apr. 7, 2015 for U.S. Appl. No. 14/028,357, 159 pgs.

(56) References Cited

OTHER PUBLICATIONS

Englekirk, Robert Mark, Response After Final Office Action filed in the USPTO dated Jun. 8, 2015 for U.S. Appl. No. 14/028,357, 3 pgs.
Patel, Reema, Notice of Allowance received from the USPTO dated Jun. 25, 2015 for U.S. Appl. No. 14/028,357, 12 pgs.
Ranta, Tero Tapio, Prliminary Amendment filed in the USPTO dated Jul. 8, 2015 for U.S. Appl. No. 14/638,917, 8 pgs.
Wong, Alan, Notice of Allowance received from the USPTO dated Aug. 17, 2015 for U.S. Appl. No. 13/595,893, 12 pgs.
Ichikawa, Takenori, Office Action and English translation received from the JPO dated Aug. 18, 2015 for appln. No. 2013-181032, 15 pgs.
Peregrine Semiconductor Corporation, Response filed in the EPO dated Sep. 10, 2015 for appln. No. 14165804.7, 14 pgs.
Le, Dinh Thanh, Office Action received from the USPTO dated Sep. 22, 2015 for U.S. Appl. No. 14/165,422, 4 pgs.
Le, Dinh Thanh, Office Action received from the USPTO dated Jan. 11, 2016 for U.S. Appl. No. 14/165,422, 47 pgs.

* cited by examiner

| bit 0 | bit 1 | bit 2 | bit 3 | bit 4 |
|---|---|---|---|---|
| $A_0 = 1.00$ | $A_1 = 0.97$ | $A_2 = 0.95$ | $A_3 = 0.93$ | $A_4 = 0.91$ |
| $B_0 = 1.00$ | $B_1 = 0.87$ | $B_2 = 0.70$ | $B_3 = 0.58$ | $B_4 = 0.48$ |

Total Gate Periphery: 143 mm

DIGITALLY TUNED CAPACITORS WITH TAPERED AND RECONFIGURABLE QUALITY FACTORS

CROSS REFERENCE TO RELATED APPLICATIONS

The present application is a continuation-in-part of U.S. patent application Ser. No. 12/735,954 filed on Aug. 27, 2010, incorporated herein by reference in its entirety, which application is a 371 National Stage Entry of PCT Patent International Application No. PCT/US09/01358 filed on Mar. 2, 2009, entitled "Method and Apparatus for use in Digitally Tuning a Capacitor in an Integrated Circuit Device", which PCT Application No. PCT/US09/01358 claims the benefit under 35 U.S.C. section 119(e) of provisional Application No. 61/067,634 filed Feb. 28, 2008.

FIELD

The present disclosure relates to tuning of capacitors. More particularly, the disclosure relates to digitally tuned capacitors with tapered and reconfigurable quality factors.

SUMMARY

According to a first aspect of the present disclosure, a digitally tuned capacitor (DTC) adapted for use in a circuit device is provided, the DTC comprising: a first terminal; a second terminal; and a plurality of bit stages in parallel between the first terminal and the second terminal, each bit stage comprising at least one switch connected with at least one capacitor, wherein: the plurality of bit stages is configured to be controlled by a numeric control word in binary representation, each bit of the numeric control word representing a switching state of one bit stage in the plurality of bit stages, wherein the switching state is either an ON state or an OFF state, and states of the DTC with same number of ON states is configured to provide a variable quality factor while maintaining a constant or near constant capacitance around a fixed level.

According to a second aspect of the present disclosure, a method of digitally tuning a tunable capacitor in a circuit device is provided, the method comprising: providing a first terminal; providing a second terminal; providing a plurality of bit stages connected in parallel between the first terminal and the second terminal, each bit stage comprising at least one switch connected with at least one capacitor; applying a numeric control word in binary representation to the plurality of bit stages, each bit of the numeric control word representing a switching state of one bit stage in the plurality of bit stages, wherein the switching state is either an ON state or an OFF state; selectively controlling capacitance between the first terminal and the second terminal based on switching states of each bit stage in the plurality of bit stages; and configuring states of the tunable capacitor with same number of ON states to provide a variable quality factor while maintaining a constant or near constant capacitance around a fixed level.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 7A shows a max-to-min tapered-Q whereas FIG. 7B shows a min-to-max tapered-Q.

FIG. 9A shows a parallel circuit. FIG. 9B shows a series circuit equivalent of the parallel circuit of FIG. 9A.

FIGS. 12A-12D show the capacitances and Q values for a DTC with five transistor stacks, where one, two, three, and four transistor stacks are in an ON state, respectively. FIG. 12E shows the capacitances and Q values for a DTC with five transistor stacks for a zero-bit case (all transistors are in an OFF state) and a penta-bit case (all transistor stacks are in an ON state).

DETAILED DESCRIPTION

Figure 1:
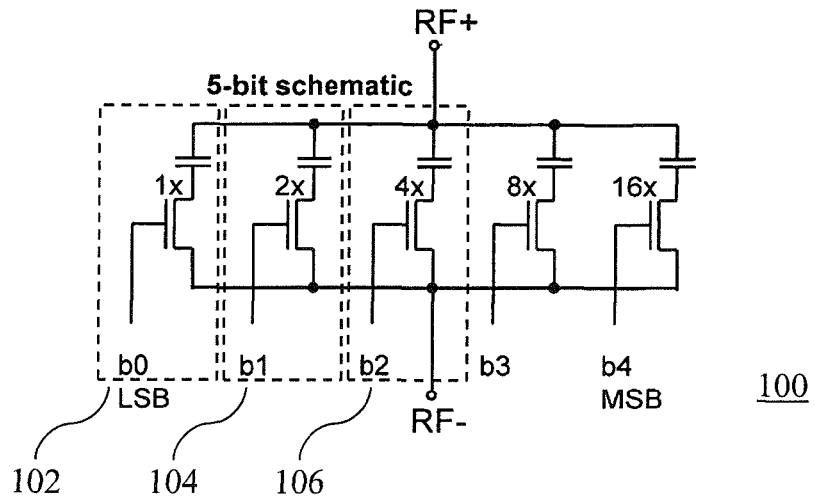
FIG. 1 shows a simplified schematic representation of an implementation of a digitally tuned capacitor (DTC).

As used in the present disclosure, the terms "tunable", "tuned", and "tuning" can be used interchangeably with the terms "adjustable", "variable", "programmable", and "configurable". The term "digitally tuned" used in "digitally tuned capacitor" (DTC) refers to tuning (varying) of capacitor values in discrete increments. For example, a digitally tuned capacitor can be implemented such that its possible capacitance values are C through nC in steps of C (i.e., the digitally tuned capacitor can have capacitance values of C, 2C, 3C, . . . , (n−1)C, and nC). As another example, a digitally tuned capacitor can be implemented with no set pattern in its possible capacitance values (e.g., 0.5C, C, 6C, 100C, and 125C). Possible capacitance values of the digitally tuned capacitor can be adjusted as necessary for a desired application.

As used in the present disclosure, a "state" associated with a DTC provides a manner for identifying which combination of switching devices in the DTC are ON or OFF.

According to several embodiments of the present disclosure, a tunable capacitor can be implemented through connections between capacitors and switching devices. Depending on state (i.e., ON or OFF) of each switching device in the tunable capacitor, capacitance and/or quality factor (Q) of the tunable capacitor can be tuned. The on or off nature of such control of the capacitance can lead to better control of performance, such as, for instance, in terms of Q value and signal linearity. As will be shown later in the present disclosure, some states of the tunable capacitor can be associated with a common capacitance value but be configured for different Q, or vice versa, where each state involves a particular combination of ON or OFF switching devices in the tunable capacitor. In some embodiments, the tunable capacitor can be implemented using devices that are inherently variable capacitors, such as voltage-controlled varactors, metal-oxide-semiconductor (MOS) capacitors, and barium strontium titanate (BST) films. An inherently variable capacitor can be (but need not be) connected to one or more switching devices.

Control of the states of the switching devices can be performed via signals applied to the switching devices by a controller. The controller is generally a digital device, such as a microprocessor or a digital signal processor. For purposes of discussion, the switching devices will be assumed to be field effect transistors (FETs). However, the present disclosure can also utilize other switching devices such as accumulated charge control field effect transistors, microelectromechanical system (MEMS) switches, diodes, diode connected bipolar junction transistors (BJTs), and other switching devices identifiable by a person skilled in the art.

According to several embodiments of the present disclosure, a tunable capacitor can comprise capacitors, where each capacitor is connected with a stack of switches. By way of example and not of limitation, consider a stack of transistors. Reliability considerations of transistors affect maximum amount of voltage, also referred to as a breakdown voltage or withstand voltage, that can be placed from drain to source of any particular transistor. Specifically, above the withstand voltage, the transistors used in implementing a system can break down, leaving the system unable to accomplish an intended purpose. A transistor stack, where two or more transistors are serially connected, can be utilized to allow the serially connected transistors to share a voltage applied to the transistor stack. For example, if each transistor has a withstand voltage of around 3 V, then a stack of five transistors would ideally be expected to have a withstand voltage of around 15 V. Consequently, a higher number of stacked transistors can be used in systems that involve higher voltages in order to withstand these higher voltages. Losses in the transistors due to various parasitics, such as parasitic capacitances that conduct current in various (e.g., including undesirable) directions, would generally lead to a withstand voltage lower than the expected 15 V. In a field effect transistor, for instance, the withstand voltage of an individual FET can be increased by increasing gate length, although this leads to occupation of more area on a chip for the individual FET and also to a generally slower switching FET.

In general, device reliability is a concern when switches are OFF. When the switches are OFF, the switches need to withstand voltage applied to the switches. Consequently, with a stack of switches, peak voltage of an applied signal, such as a radio frequency (RF) signal, can be higher than in the case with only one switch since voltage of the applied signal can be shared across each switch in the stack.

It should be noted that although lumped elements (e.g., discrete resistors, capacitors, and inductors) are depicted throughout the present disclosure, the embodiments of the present disclosure to be described below can also utilize distributed elements. Specifically, resistances, capacitances, and inductances can be distributed throughout a circuital arrangement and thus can be generally measured per unit length (e.g., $\Omega$/length, F/length, and H/length, respectively). For example, transmission line elements such as half-wavelength, quarter-wavelength, series and parallel stubs (open circuit or short circuit stubs), and resonant stubs can also be utilized to provide resistances and reactances to the circuital arrangement. It should be noted that the various elements (either lumped or distributed) can be on-chip or off-chip.

Figure 2:
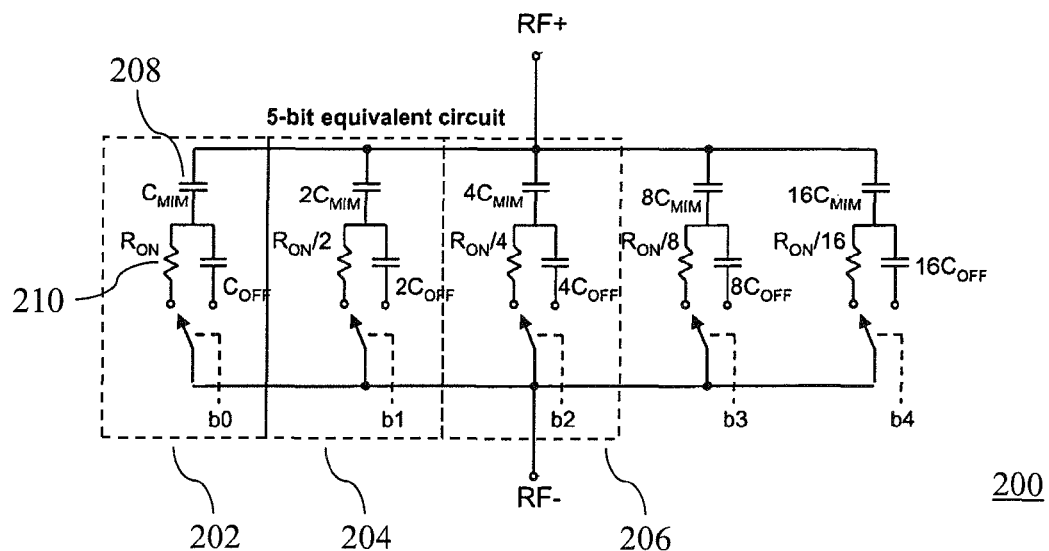
FIG. 2 shows an equivalent circuit of the DTC shown in FIG. 1.

FIG. 1 shows a simplified schematic representation of an implementation of a digitally tuned capacitor (DTC). FIG. 2 is an equivalent circuit showing ON resistances $R_{ON}$ and OFF capacitances $C_{OFF}$ associated with switching transistors of the DTC shown in FIG. 1. Additional examples of DTCs are shown in U.S. patent application Ser. No. 12/735,954, incorporated herein by reference in its entirety. Both $R_{ON}$ and $C_{OFF}$ are functions of size (e.g., width) of the switching transistors.

More specifically, FIGS. 1 and 2 show a representation of a five-bit DTC (100) along with an exemplary equivalent circuit model (200) of the representation, respectively. The five-bit DTC (100) can be designed to exhibit a constant Q value for each bit stage using binary coding. This constant Q value is achieved by first designing an initial bit stage $b_0$ (102, 202) that provides a set quality factor. For reasons that will be apparent later in the disclosure, the initial bit stage $b_0$ (102, 202) can also be referred to as a unit cell.

Then, for the case of binary coding, in order to achieve the same Q in a next bit stage $b_1$ (104, 204), value of $C_{MIM}$ (208) and device periphery of the unit cell (102, 202) are both doubled. Doubling device periphery (specifically, doubling periphery of a transistor) effectively halves $R_{ON}$ (210). Hence, constant $R_{ON}C_{MIM}$ can be maintained between bit stages $b_0$ (102, 202) and $b_1$ (104, 204). Components in bit stage $b_1$ (104, 204) can be similarly scaled (value of $C_{MIM}$ and device periphery are doubled) to achieve bit stage $b_2$ (106, 206). Similar $C_{MIM}$ and device periphery doubling occurs for bit stages $b_3$ and $b_4$.

As previously mentioned, the initial bit stage $b_0$ (102, 202) can also be referred to as a unit cell. For example, bit stage $b_1$ (104, 204) can be implemented using two initial bit stages $b_0$ (102, 202) in parallel and similarly bit stage $b_2$ (106, 206) can be implemented using four initial bit stages $b_0$ (102, 202) in parallel.

Type of capacitor utilized in implementing the DTC (100, 200) is generally chosen such that the capacitor or capacitors used to implement $C_{MIM}$ (208 in FIG. 2) in bit stage $b_0$ (202 in FIG. 2), $2C_{MIM}$ in bit stage $b_1$ (204 in FIG. 2), and so forth can withstand possible voltages to be applied at terminals RF⁻ and RF⁺ across the DTC (100, 200). Although a metal-insulator-metal (MIM) capacitor, denoted as $C_{MIM}$, is utilized in this disclosure for discussion purposes, other types of capacitors identifiable by a person skilled in the art can be utilized in place of or in combination with the MIM capacitor.

It should be noted that implementation of the DTC is dependent on application. For example, in applications where a maximized Q is desirable, the maximized Q can be associated with a minimization of ON resistance $R_{ON}$ of a transistor, which can be obtained through maximization of transistor periphery as described above. Examples of constraints on minimizing $R_{ON}$ include chip area and minimum required capacitance of the DTC.

With respect to chip area, a smaller $R_{ON}$ can be associated with a larger transistor, and thus minimization of $R_{ON}$ through maximization of transistor periphery is dependent on amount of chip area available. With respect to minimum required capacitance of the DTC, larger devices are generally associated with larger parasitic capacitances. Consequently, larger devices are also generally associated with a larger minimum capacitance state of the DTC, denoted as $C_{min}$. For example, if a $C_{min}$ state of 0.5 pF is required of the DTC based on system specifications, using devices (such as transistors) that are too large may cause the $C_{min}$ state to be higher than 0.5 pF (e.g., 1 pF). Consequently, in the example of maximizing Q, a tradeoff exists between maximum Q possible with consideration to chip area and minimum capacitance possible.

The DTC shown in FIGS. 1 and 2 can function as a variable reactance in an impedance matching network. Since quality factor Q of capacitors is given by $Q=1/(\omega RC)$, where $\omega$ is (angular) frequency of a signal applied to the capacitor, a constant $R_{ON}C_{MIM}$ for each bit stage can be specified to achieve a constant quality factor Q for each bit stage.

In practice, voltage seen across the digitally tuned capacitor is proportional to Q. Consequently, in an impedance matching network, a DTC with a higher Q generally has higher voltages across the DTC than a DTC with a lower Q. In order to accommodate the higher voltages due to higher Q values, the DTC can comprise higher transistor stacking, which leads to occupation of more chip area.

As used in this disclosure, a "state" associated with a DTC provides a manner for identifying which combination of transistors are ON or OFF. The bit stages $b_0$ (102, 202) through $b_4$ form a numeric control word in binary representation that determines the state of the DTC. Each control word is associated with a plurality of control signals that turns transistors in the DTC on or off.

For instance, Table 1 below shows possible states $b_4 b_3 b_2 b_1 b_0$ of the five-bit DTC shown in FIGS. 1 and 2. A $b_0$ of '0' can refer to a situation where a zeroth transistor (102 in FIG. 1) is turned OFF while in this case a $b_0$ of '1' would refer to a situation where the zeroth transistor (102 in FIG. 1) is turned ON, or vice versa (i.e., a '0' can be associated with a transistor being turned ON while a '1' can be associated with a transistor being turned OFF). As an example, a state is given by $b_4 b_3 b_2 b_1 b_0$, so a state or numeric control word of 01001 signifies that a fourth, second (106 in FIG. 1), and first transistor (104 in FIG. 1) are in a first state while a third and zeroth transistor (102 in FIG. 1) are in a second state. It should be noted that a bit $b_0$ can be referred to as a least significant bit (LSB) and a bit $b_4$ can be referred to as a most significant bit (MSB), or vice versa. Such a designation is for convenience in discussion and is not necessarily associated with capacitance value, transistor size, and/or quality factor associated with a particular bit stage.

TABLE 1

Possible states of a five-bit configuration of a DTC

| State | b4 | b3 | b2 | b1 | b0 |
|---|---|---|---|---|---|
| 0 | 0 | 0 | 0 | 0 | 0 |
| 1 | 0 | 0 | 0 | 0 | 1 |
| 2 | 0 | 0 | 0 | 1 | 0 |
| 3 | 0 | 0 | 0 | 1 | 1 |
| 4 | 0 | 0 | 1 | 0 | 0 |
| 5 | 0 | 0 | 1 | 0 | 1 |
| 6 | 0 | 0 | 1 | 1 | 0 |
| 7 | 0 | 0 | 1 | 1 | 1 |
| 8 | 0 | 1 | 0 | 0 | 0 |
| 9 | 0 | 1 | 0 | 0 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 16 | 1 | 0 | 0 | 0 | 0 |
| 17 | 1 | 0 | 0 | 0 | 1 |
| 18 | 1 | 0 | 0 | 1 | 0 |
| 19 | 1 | 0 | 0 | 1 | 1 |
| 20 | 1 | 0 | 1 | 0 | 0 |
| 21 | 1 | 0 | 1 | 0 | 1 |
| 22 | 1 | 0 | 1 | 1 | 0 |
| 23 | 1 | 0 | 1 | 1 | 1 |
| 24 | 1 | 1 | 0 | 0 | 0 |
| 25 | 1 | 1 | 0 | 0 | 1 |
| 26 | 1 | 1 | 0 | 1 | 0 |
| 27 | 1 | 1 | 0 | 1 | 1 |
| 28 | 1 | 1 | 1 | 0 | 0 |
| 29 | 1 | 1 | 1 | 0 | 1 |
| 30 | 1 | 1 | 1 | 1 | 0 |
| 31 | 1 | 1 | 1 | 1 | 1 |

As used in the present disclosure, a "lower" state can refer to a state whose corresponding decimal value is lower than that of a "higher" state. For example, in the five-bit DTC, a state 00000 (corresponding to decimal value 0) can be referred to as the lowest state while a state 11111 (corresponding to decimal value 31) can be referred to as the highest state.

As mentioned above, a unit cell of a DTC can comprise one transistor connected with a capacitor, where state of the transistor determines whether the capacitor contributes to capacitance of the DTC (i.e., switching of the capacitance in or out of the DTC). The unit cell can also comprise a stack of transistors connected with the capacitor, where state of each transistor in the stack of transistors determines whether the capacitor contributes to capacitance of the DTC.

Figure 3A:
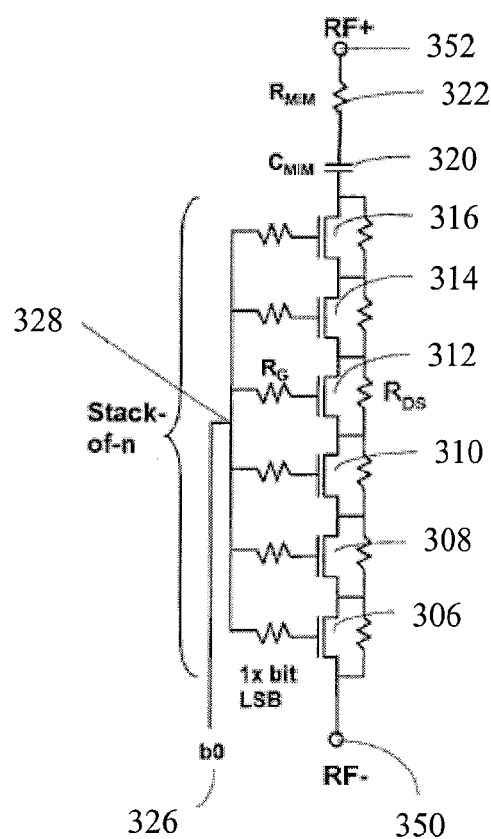
FIG. 3A shows a circuital arrangement of a stack of transistors connected with a capacitor.

FIG. 3A shows a circuital arrangement of a stack of n transistors (306, 308, 310, 312, 314, 316) connected with a capacitor (320). Components in the schematic of FIG. 3A can be utilized as a unit cell (102 in FIG. 1, 202 in FIG. 2) of a DTC. The unit cell can comprise a stack of transistors (306, 308, 310, 312, 314, 316) coupled with a first terminal RF⁻ (350) on one end and coupled with a capacitor $C_{MIM}$ (320) on another end. A resistance $R_{MIM}$ (322) represents an equivalent series resistance (ESR) of the capacitor $C_{MIM}$ (320). The capacitor $C_{MIM}$ (320) is coupled with a second terminal RF⁺ (352). Designation of positive sign and negative sign to the terminals (350, 352) is arbitrary and does not necessarily indicate relative polarity of the terminals (350, 352). Furthermore, either of the terminals (350, 352) may be coupled to ground.

For discussion purposes, consider the case where the stack of transistors (306, 308, 310, 312, 314, 316) is a stack of field effect transistors (FETs). The unit cell can also comprise gate resistors $R_G$ coupled to a gate of each of the FETs (306, 308, 310, 312, 314, 316). A control bit $b_0$ (326) applied to the FETs (306, 308, 310, 312, 314, 316) through the gate resistors can control ON or OFF state of the FETs (306, 308, 310, 312, 314, 316) in the stack. Voltage at a node (328) is based on value of the control bit $b_0$ (326). The unit cell can further comprise drain-to-source resistors $R_{DS}$. The gate and drain-to-source resistors can aid in biasing their associated and corresponding FETs.

Figure 3B:
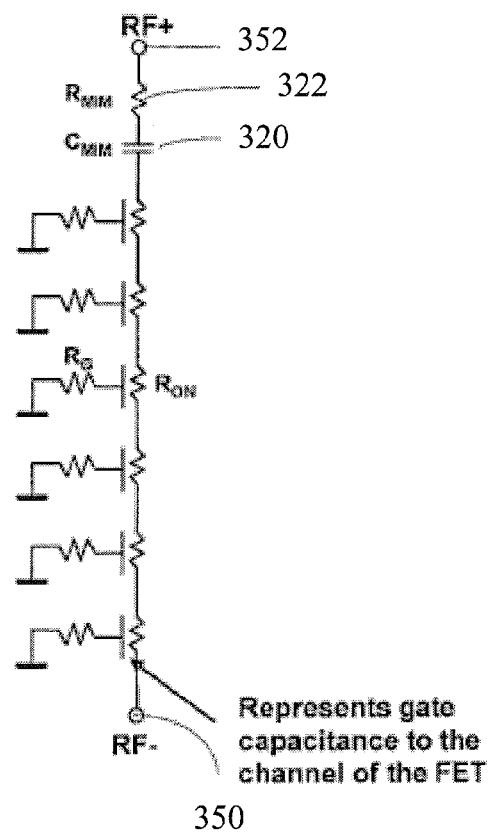
FIG. 3B shows an equivalent circuit of the circuital arrangement of FIG. 3A when the transistors in the stack of transistors are in an ON state.

FIG. 3B shows an equivalent circuit of the circuital arrangement of FIG. 3A when the transistors are in an ON state. As with FIG. 3A, the equivalent circuit shown in FIG. 3B shows a stack of transistors (in an ON state) coupled to a first terminal RF (350) on one end and a capacitor $C_{MIM}$ (320) on another end. The capacitor $C_{MIM}$ (320) is depicted as a capacitor and its equivalent series resistance $R_{MIM}$ (322) and is coupled with a second terminal RF$^+$ (352). In FIG. 3B, each of the transistors (306, 308, 310, 312, 314, 316 in FIG. 3A) in the stack can be represented by a resistor. Equivalent resistance of the stack can be collectively denoted as $R_{ON}$ and referred to as ON resistance. In contrast, when the transistors in the stack are turned OFF (not shown in FIG. 3B), equivalent capacitance of the stack can be collectively denoted as $C_{OFF}$ and referred to as OFF capacitance.

Figure 4:
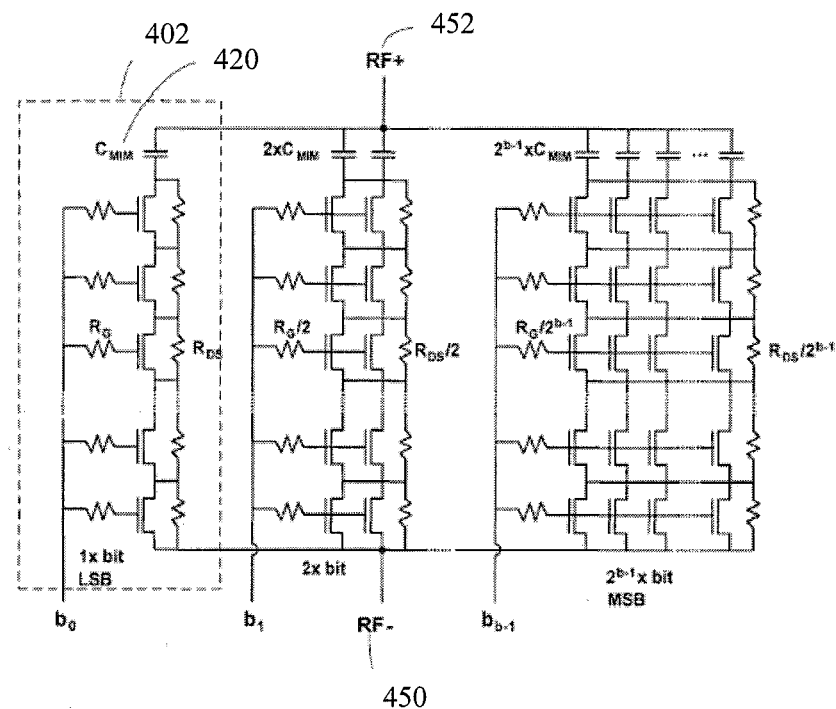
FIG. 4 shows an implementation of a DTC using the circuital arrangement of FIG. 3A.

FIG. 4 shows an implementation of a DTC using the circuital arrangement of FIG. 3A, where the DTC is coupled to a first terminal RF (450) and a second terminal RF$^+$ (452). As mentioned in FIG. 3A, the circuital arrangement of FIG. 3A can be utilized as a unit cell for building of the DTC. A first bit stage (402) can comprise the unit cell shown in FIG. 3A while subsequent bit stages can comprise a plurality of unit cells tied to a common control bit (e.g., $b_1 \ldots b_{b-1}$). In the implementation shown in FIG. 4, along with scaling number of unit cells and capacitance (420) in each unit cell, gate resistances and drain-to-source resistances can also be scaled.

Figure 5:
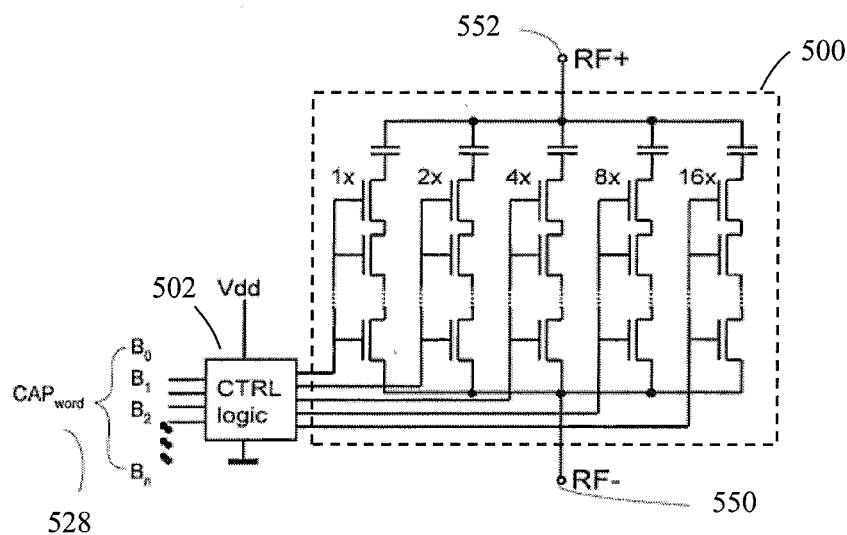
FIG. 5 shows a system that comprises a DTC coupled with a controller.

FIG. 5 shows a system that comprises a DTC (500) coupled with a controller (502). A digital control word $CAP_{word}$ (528) can be applied to the controller (502) in order to generate control bits configured to control ON or OFF state of transistors in the DTC (500). The DTC (500) can be tied to a first terminal RF (550) and a second terminal RF$^+$ (552). Designation of positive sign and negative sign to the terminals (550, 552) is arbitrary and does not necessarily indicate relative polarity of the terminals (550, 552). Either of the terminals (550, 552) may be coupled to ground. As previously mentioned, the controller (502) is generally a digital device, such as a microprocessor or a digital signal processor.

Each of the DTCs shown in FIGS. 1, 2, 3A, 3B, and 4 can be utilized as the DTC (500) shown in FIG. 5. The DTCs shown in U.S. patent application Ser. No. 12/735,954, incorporated herein by reference in its entirety, can also be utilized in the system of FIG. 5. Furthermore, as used herein, the term "stack" includes both the case where a stack comprises only one device (e.g., a stack of one switch or transistor) as well as the case where the stack comprises a plurality of devices (e.g., a stack of multiple serially connected switches or transistors).

Figure 6:
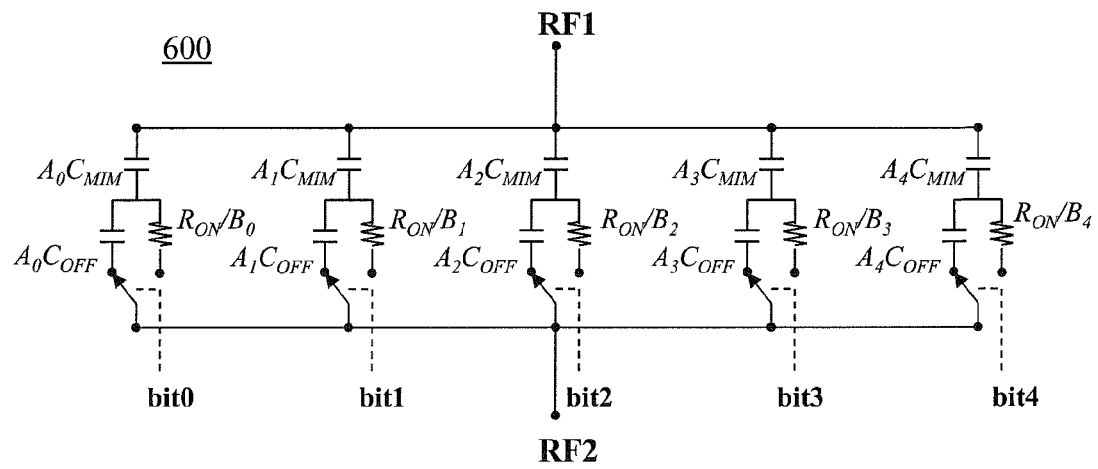
FIG. 6 depicts an implementation of a DTC with constant quality factor Q. Exemplary values for coefficients $A_n$ and $B_n$ for the DTC are provided, where the coefficients scale values of capacitances and resistances, respectively.

FIG. 6 illustrates a DTC (600) whose $R_{ON}C_{MIM}$ product stays constant, or more specifically $(R_{ON}/B_n)(A_nC_{MIM})$ stays constant, for each bit stage. In FIG. 6, a constant $R_{ON}C_{MIM}$ is achieved by setting coefficients $A_n$ and $B_n$ to $2^n$ for all n. The DTC (600) has a constant Q for each bit stage, and the state of each bit stage determines the capacitance of the DTC (600). Such a combination of coefficients is known as binary coding and has been previously shown in FIGS. 1 and 2. A constant Q design can aid in minimizing signal loss while maximizing Q.

It should be noted that $(R_{ON}/B_n)(A_nC_{MIM})$ being constant can be achieved through other means aside from binary coding. For example, a case where $A_n=B_n=$constant for all possible n also keeps $(R_{ON}/B_n)(A_nC_{MIM})$ constant. However, the binary case generally involves less on-chip routing, which decreases parasitic capacitances and leads to less signal loss. Furthermore, the binary case can involve fewer drivers to drive RF states, so chip area may be conserved.

Maintaining constant $R_{ON}C_{MIM}$, however, might not allow a designer to choose an optimal Q, for a fixed capacitance, for a particular application. In addition, use of a DTC (100, 200) that maintains constant $R_{ON}C_{MIM}$ throughout the bit stages (e.g., $b_0$ (102, 202), $b_1$ (104, 204), etc. shown in FIGS. 1 and 2) can also consume more chip area. For a bounded design space or area, Q may not be maximized in the case of constant $R_{ON}C_{MIM}$.

Specifically, in a constant Q design where $R_{ON}C_{MIM}$ is constant, each bit stage scales linearly as previously discussed. For instance, as previously mentioned in the case of binary coding, to keep Q constant by doubling $C_{MIM}$ for successive bit stages, ON resistance in one bit stage is half the value of ON resistance of a next bit stage. In order to reduce ON resistance by half, device (transistor) area or periphery can be doubled. Consequently, the $b_1$ bit stage (104, 204) shown in FIGS. 1 and 2 comprises an area around twice that of the area for the $b_0$ bit stage (102, 202), the $b_2$ bit stage (106, 206) comprises an area around four times that of the area of the $b_0$ stage (102, 202), and so forth.

The constant Q design can lead to consumption of more area by the DTC than a tapered-Q approach, as will be discussed later in the present disclosure. For example, a constant $R_{ON}C_{MIM}$ may use a constant bit-to-bit stack height at each bit stage such that each bit stage can withstand voltage applied at terminals RF$^-$ and RF$^+$, which can involve more chip area than the tapered-Q approach. Furthermore, higher Q is generally associated with higher voltages, which may require an increased stack height (and thus use of more chip area) to withstand these higher voltages.

Embodiments of the present disclosure are directed to a DTC that utilizes a variable $R_{ON}C_{MIM}$ to achieve a "tapered" quality factor for each bit stage. By way of example and not of limitation, binary and thermometer codes can be utilized to implement the DTC with tapered quality factor.

According to an embodiment of the present disclosure, a DTC with a variable $R_{ON}C_{MIM}$ between states can provide a reconfigurable Q while maintaining constant (or near constant) DTC capacitance C. As used herein, a "constant capacitance" between states also includes the case where capacitance between states is near constant (or close to equal), but not exactly equal. A person skilled in the art recognizes that due to issues such as, but not limited to, tolerances of components (e.g., capacitors), operating conditions (e.g., temperature and pressure), and parasitics associated with any component, actual value (e.g., actual capacitance value) can fluctuate about a nominal value. As previously noted, voltage seen across the DTC is proportional to the quality factor. Consequently, the DTC can be configured for a high Q, hence low loss, when peak voltages are not a concern. On the other hand, the DTC can be configured for a low Q when peak voltages are a concern. Such a DTC has numerous applications.

For example, DTCs at a constant DTC capacitance value C and with variable Q values can be used to adjust system bandwidths. A tuning bandwidth, which refers to a frequency range that a system passes through relatively unattenuated, can be adjusted based on quality factor of the DTC.

Consider a system with two receivers that utilizes a bandpass matching network, where capacitance in the bandpass matching network is provided by a DTC. Further, consider that both of the receivers have a center frequency of 1850 MHz, but one operates within a frequency range of 1800 MHz to 1900 MHz and the other operates within a frequency range of 1750 MHz to 1950 MHz. Then, the same bandpass matching network (i.e., the same LC element values), which comprises the DTC, can be used to tune both receivers.

For a DTC at a set capacitance value, difference between the bandpass network in each receiver will be in the Q value, which is reconfigurable. The bandpass network in the 1800-1900 MHz receiver will have a DTC with a capacitance value C but can be configured with a higher Q value while the bandpass network in the 1750-1950 MHz receiver will have the same capacitance value C but can be configured with a lower Q value. Specifically, when used to transform impedances, a high Q DTC (i.e., a DTC operating in a state of higher Q) can be used to tighten the tuning bandwidth while a low Q DTC (i.e., a DTC operating in a state of lower Q) can be used to widen the tuning bandwidth. Tradeoff between high versus low Q is that a DTC operating in a state with higher Q provides a narrower (tighter) bandwidth and generally adds less loss whereas a DTC operating in a state with lower Q provides more bandwidth and generally adds more loss.

Figure 7A:
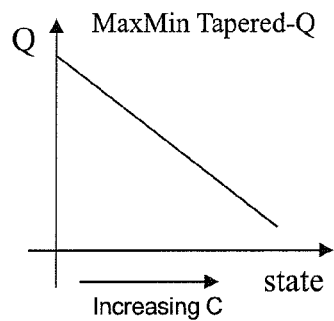
FIGS. 7A and 7B show exemplary monotonic quality factors as a function of state of a DTC. Specifically.
Figure 7B:
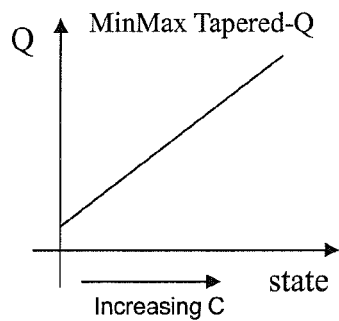

FIGS. 7A and 7B show quality factor of a DTC as a function of state of the DTC. Graphs in FIGS. 7A and 7B show monotonic quality factors. However, the person skilled in the art will understand that other Q-varying mechanisms can be used that will result in a configurable quality factor. Additionally, different coding schemes (e.g., binary, thermometer, etc.) can be applied. For the sake of simplicity and by way of example only, a thermometer coding scheme will be referenced in several parts of the present disclosure.

As shown in FIGS. 7A and 7B, the tapered-Q approach has a maximum Q at one end of the capacitance tuning range, where this maximum Q can be higher than quality factor achieved in a constant Q design (e.g., $R_{ON}C_{MIM}$ remains a constant between states), and a minimum Q at the other end of the capacitance tuning range, where this minimum Q can be lower than that achieved in a constant Q design. According to several embodiments of the present disclosure, depending on application to which the DTC is to be applied, area utilized by each bit stage can be designed such that a particular set of Q values can be associated with different states of the DTC. As a result, a tapered-Q DTC may be designed to occupy less chip area than a constant-Q DTC since a tapered-Q DTC may use fewer transistors in one or more stacks than a constant-Q DTC.

Max-to-min tapered-Q, shown in FIG. 7A, can be utilized in high frequency applications where low capacitance values are generally utilized. MM-to-max tapered-Q, shown in FIG. 7B, can be utilized in low frequency applications where high capacitance values are generally utilized. One exemplary application is that of utilizing DTCs in an impedance matching network. It is well known that impedance of a capacitor is given by $Z=1/(j\omega C)$, Consequently, for components to be matched by an impedance matching network of impedance Z, a higher operating frequency $\omega_{HI}$ would utilize a lower DTC capacitance value $C_{LO}$ while a lower operating frequency $\omega_{LO}$ would utilize a higher DTC capacitance value $C_{HI}$, where $\omega_{HI}C_{LO}=\omega_{LO}C_{HI}$ since the impedance Z of the impedance matching network is the same in both cases.

As shown in FIGS. 7A and 7B, lower states can be designed to be associated with lower capacitance while higher states can be designed to be associated with higher capacitance. In a five-bit case, 00000 would generally be considered the lowest state while 11111 would generally be considered the highest state. In another embodiment, the lower states can be designed to be associated with higher capacitance while higher states can be designed to be associated with lower capacitance.

According to several embodiments of the present disclosure, a tapered quality factor allows configuration of the quality factor in designs bounded by the area of the devices. For example, the quality factor of a particular state can be maximized with consideration to area requirements. The tapered quality factor enables a tailoring of the quality factor response such that the quality factor can be maximized where it is needed most and minimized where it is needed least in the tuning application. Implementation of the tapered quality factor lends itself to less transistor stacking for bit stages where the quality factor is maximized. Specifically, the transistor stacks associated with an OFF state need to be of sufficient stacking in order to withstand the higher voltages generally associated with a higher quality factor. Less transistor stacking results in higher $C_{OFF}$ since an effective $C_{OFF}$ of an η transistor stack is given by $C_{OFF}=(1/C_{OFF1}+1/C_{OFF2}+\ldots+1/C_{OFFn})^{-1}$.

Consequently, by using a DTC with tapered quality factor (when compared with a DTC with constant quality factor), less stack height can be utilized to achieve the same voltage handling as in the case of a DTC with constant quality factor, as shown in the following expression $$\eta_{\mathit{eff}} = \eta * \left(1 + \frac{C_{OFF}}{C_{MIM}}\right) \quad (1)$$

where η is the transistor stack height and $\eta_{\mathit{eff}}$ is the effective stack height.

For a given stack height η, effective stack height $\eta_{\mathit{eff}}$ increases as $C_{OFF}$ increases. In some bit stages, stack height can be reduced, which would lead to a reduction in the effective stack height $\eta_{\mathit{eff}}$ if $C_{MIM}$ were to remain constant or increase. However, in the tapered-Q DTC, $C_{MIM}$ can be reduced as well. Consequently, even though stack height is reduced, the effective stack height and thus the voltage withstand of the switch can remain the same. As a result, tapered-Q DTC can reduce area consumption of the devices (such as relative to the constant-Q DTC) without necessarily reducing the voltage withstand.

When appropriately designed, less transistor stacking for the bit stage with the highest quality factor opens up more area for successive (or preceding) bit stages. For instance, if a bit stage associated with highest Q is the least significant bit (LSB), more area is opened for successive bit stages (i.e., bit stages after the LSB). Similarly, if a bit stage associated with highest Q is the most significant bit (MSB), more area is opened up for preceding bit stages (i.e., bit stages before the MSB).

As the quality factor decreases about its maximum, ON resistance $R_{ON}$ can increase across the remaining bit stages, and therefore transistor peripheries can be reduced (since transistor periphery is inversely proportional to $R_{ON}$ as previously mentioned). If the transistor peripheries were to become too small such that $C_{OFF}$ in equation (1) above for the FET stack becomes too small to provide an adequate effective stack height $\eta_{eff}$ to reliably sustain voltages seen by the DTC, then an additional device (such as an additional transistor) can be added to the stack to boost voltage handling capability. The area savings by maximizing quality factor for the first (last) bit generally outweigh any increases in stack height for successive (or preceding) stages, and thus there is a net area reduction due to utilization of a tapered quality factor for the DTC.

According to several embodiments of the present disclosure, a DTC can provide a fixed capacitance and a reconfigurable quality factor. Such an embodiment adds value at the application level in that a system that comprises such a DTC can be set to a particular state depending on whether higher Q should be used to achieve less loss or lower Q should be used to achieve lower voltage peaks (but associated with more loss). The DTC can also be configured for lower (higher) Q to achieve more (less) system bandwidth. In practice, end-use application would tune the DTC to find an optimal solution that maximizes voltage peaks (lowers loss) without exceeding reliability limits and achieves system bandwidth requirements.

Figure 8:
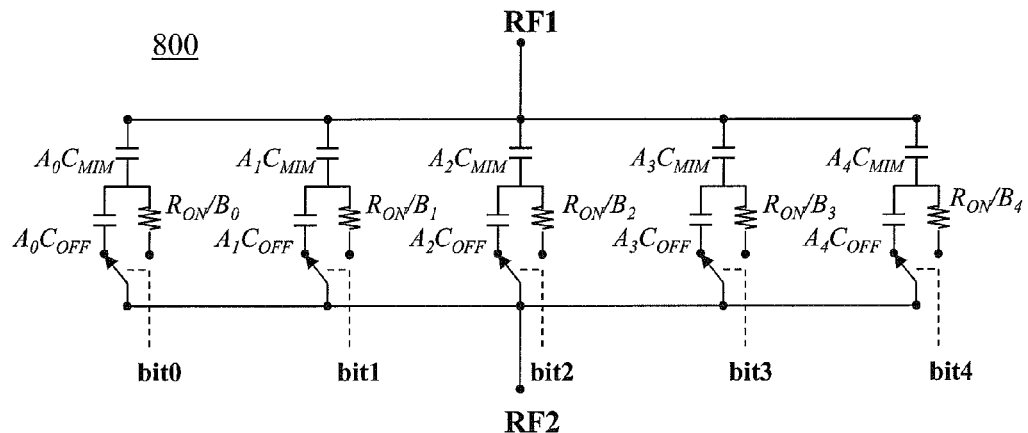
FIG. 8 depicts exemplary values for coefficients $A_n$ and $B_n$ for a DTC.

According to several embodiments of the present disclosure, design of tapered-Q DTCs comprises obtaining $C_{MIM}$ and $R_{ON}$ and their corresponding scaling coefficients $A_n$ and $B_n$, as depicted for instance in FIG. 8. An exemplary method to acquire each of these values is provided as follows.

In a first step, independent variables are selected by a designer based on one or more applications under consideration. Table 2 below provides these independent variables.

TABLE 2

Independent variables

| Independent Variables | |
|---|---|
| $f_o$ | operating frequency |
| b | number of bits (number of bit stages) |
| n | incremental bit order (i.e., n = 0, 1, 2, . . . , b) |
| N | number of states |
| $\eta_{eff}$ | effective stack height |
| $C_0$ | capacitance at state 0 |
| $C_N$ | capacitance at state N |
| $Q_0$ | quality factor at state 0 |
| | ($Q_{min}$ occurs at state 0 for min-to-max taper; $Q_{max}$ occurs at state 0 for max-to-min taper) |
| $Q_N$ | quality factor at state N |
| | ($Q_{min}$ occurs at state N for max-to-min taper; $Q_{max}$ occurs at state N for min-to-max taper) |
| $Q_{MIM}$ | MIM capacitor quality factor |
| $Q_{Coff}$ | device off-capacitance quality factor |
| $r_{on}$ | unit device channel resistance |
| $c_{off}$ | unit device off-capacitance |

Values for capacitances $C_n$ where 0≤n≤b, with $|C_N - C_0|$ being the capacitance tuning range of the DTC and n being a particular bit stage, are generally user or application specified. Values for unit device channel resistance $r_{on}$ and unit device channel off-capacitance $c_{off}$ are technology parameters fixed for a given process. Effective stack height $\eta_{eff}$ of a bit stage of the DTC is determined (set) based on knowledge of maximum operating voltages to be applied to and/or withstood by each transistor device. For instance, for a DTC that must be capable of handling (withstanding) 30 V with each transistor device capable of operating up to a maximum of 3 V, the effective stack height $\eta_{eff}$ can be selected to be at least 10.

It should be noted that $r_{on}$ and $c_{off}$ are ON resistance and OFF capacitance associated with a given technology. For instance, if $r_{on}$=1 Ω-mm, then a 1 mm device has 1Ω of ON resistance. Similarly, if $c_{off}$=1 pF-mm, then a 1 mm device has 1 pF of OFF capacitance. Control of values for $r_{on}$ and $c_{off}$ occurs through scaling size of the device. These parameters differ from $R_{ON}$ and $C_{OFF}$ described previously, which represent ON resistance and OFF capacitance of a particular bit stage (where the bit stage generally comprises stacked transistors).

Consider a DTC with b bit stages. For each bit stage n, a target capacitance $C_n$ and target reactance $X_n$ are given respectively by:

$$C_n = n * \left(\frac{C_N - C_0}{b}\right) \quad \text{for } 0 < n < b \quad (2)$$

$$X_n = \frac{1}{j\omega C_n} \quad \text{for } 0 < n < b \quad (3)$$

Angular frequency ω is given by $\omega = 2\pi f_o$, where $f_o$ is the operation frequency of the DTC. It should be noted that $C_n$ is evaluated for 0<n<b, e.g., not inclusive of state 0 and N, because $C_0$ and $C_N$ are values set by the user or application.

Similarly, for a bit stage n, a target quality factor is given by the following recursive equation:

$$Q_n = Q_{n-1} - \left(\frac{Q_N - Q_0}{b}\right) \quad \text{for } 0 < n < b. \quad (4)$$

The following provides additional equations to be solved in obtaining $C_{MIM}$, $r_{on}$, $A_n$, and $B_n$:

$$R_{Pn} = |Q_n * X_n| \quad \text{for } 0 < n \leq b \quad (5)$$

$$dC_n = C_n - C_{n-1} \quad \text{for } 0 < n \leq b \quad (6)$$

$$dR_{Pn} = \left(\frac{1}{R_{Pn}} - \frac{1}{R_{Pn-1}}\right)^{-1} \quad \text{for } 0 < n \leq b \quad (7)$$

$$dQ_n = \omega \cdot dR_{Pn} dC_n \quad \text{for } 0 < n \leq b \quad (8)$$

$$dR_{Sn} = \frac{dR_{Pn}}{(1 + dQ_n^2)} \quad \text{for } 0 < n \leq b \quad (9)$$

$$dR_{MIMn} = \omega Q_{MIM} \cdot dC_n \quad \text{for } 0 < n \leq b \quad (10)$$

$$dR_{ONn} = dR_{Sn} - dR_{MIMn} \quad \text{for } 0 < n \leq b \quad (11)$$

$$dC_{OFFn} = \frac{r_{on} c_{off}}{dR_{ONn}} \quad \text{for } 0 < n \leq b \quad (12)$$

$$dR_{OFFn} = \omega \cdot dC_{OFFn} Q_{COFF} \quad \text{for } 0 < n \leq b \quad (13)$$

where equations (5)-(13) can be solved to obtain (5) equivalent parallel resistance $R_{Pn}$, (6) incremental capacitance $dC_n$, (7) incremental parallel resistance $dR_{Pn}$, (8) incremental quality factor $dQ_n$, (9) equivalent incremental series resistance $dR_{Sn}$, (10) MIM resistance $dR_{MIMn}$, (11) incremental on-resistance $dR_{ONn}$, (12) incremental off-capacitance $dC_{OFFn}$, and (13) incremental series off-resistance $dR_{OFFn}$, respectively.

Figure 9A:
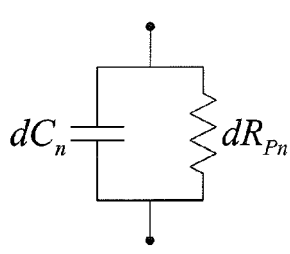
FIGS. 9A and 9B show a parallel-to-series conversion.
Figure 9B:
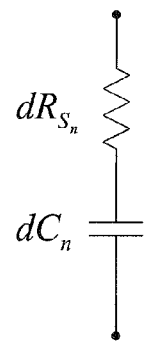

FIG. 9A shows a parallel equivalent circuit obtained through solving equations (6) and (7) for the incremental capacitance $dC_n$ and parallel resistance $dR_{Pn}$, respectively. FIG. 9B shows a series equivalent circuit of the parallel equivalent circuit of FIG. 9A, which is obtained by solving equation (9) to obtain incremental series resistance $dR_{Sn}$.

After solving equations (5)-(13), each of effective bit stage MIM capacitance $dC_{MIMn}$, bit stage stack height $\eta_n$, and bit stage device periphery $W_n$ can be obtained through the following equations:

$$dC_{MIMn} = dC_n + dC_{OFFn} \quad \text{for } 0 < n \leq b \quad (14)$$

$$\eta_n = \text{ceil}\left(\frac{\eta_{\textit{eff}} \cdot dC_{MIMn}}{dC_{MIMn} + dC_{OFFn}}\right) \quad \text{for } 0 < n \leq b \quad (15)$$

$$W_n = \eta_n \cdot \frac{r_{on}}{dR_{ON}} \quad \text{for } 0 < n \leq b \quad (16)$$

where ceil(x) is the ceiling function that outputs a smallest integer not less than x. The bit stage stack height $\eta_n$ and bit stage device periphery $W_n$ provide, for an $n^{th}$ bit stage, number of transistors and total periphery of the $\eta_n$ transistors in the stack, respectively.

Additionally, MIM and off-capacitance scaling coefficient $A_n$ and on-resistance scaling coefficient $B_n$ are given by:

$$A_n = \frac{C_0}{C_n} \quad \text{for } 0 \leq n \leq b \quad (17)$$

$$B_n = \frac{dC_{OFF0}}{dC_{OGGn}} \quad \text{for } 0 \leq n \leq b \quad (18)$$

An error function for evaluating accuracy of a designed capacitance is given by:

$$\text{erf}(C) = 1 - \frac{C_{min}}{\sum_{n=1}^{N} dC_n \| dC_{OFFn}} \quad (19)$$

where $$dC_n \| dC_{OFFn} = \frac{dC_n dC_{OFFn}}{dC_n + dC_{OFFn}} \quad \text{and} \quad -1 \leq \text{erf}(C) \leq +1.$$

Consider a DTC whose desired capacitance tuning range is 1.0 pF to 5.0 pF. In the case of erf(C)=0 (error function is zero), actual capacitance tuning range acquired is 1.0 pF to 5.0 pF. If the error function were non-zero, the actual capacitance tuning range can be shifted and/or wider/narrower than the desired capacitance range of 1.0 pF to 5.0 pF. For example, the actual capacitance tuning range could be 1.1 pF to 5.4 pF.

For any given application, value of unit device channel resistance $r_{on}$ is based on technology used in a given process while values for $C_{MIM}$ and each coefficient $A_n$ and $B_n$ can be obtained by solving equations (2)-(19). Specifically, for a particular bit stage n, $C_{MIM}$ is given by $dC_{MIMn}$ in equation (14) whereas $A_n$ and $B_n$ are given by equations (17) and (18) above.

Bounds for capacitance C and quality factor Q that can be implemented on a particular DTC can broaden or shrink depending on process technology. For instance, if OFF state capacitance $C_{OFF}$ of a device were to increase, possible range of values for the capacitance and quality factor shrinks, and vice versa for the case where $C_{OFF}$ decreases. This is shown in equation (14) above, where effective bit stage MIM capacitance $dC_{MIMn}$ is given by $dC_{MIMn}=dC_n+dC_{OFFn}$. The incremental off-capacitance $dC_{OFFn}$ is a device capacitance. As previously mentioned, whereas a larger device leads to smaller ON state resistance $R_{ON}$ and thus increases Q, the larger device also increases $dC_{OFF}$ and thus increases $dC_{MIMn}$. Consequently, ranges of capacitance and quality factor of the DTC are not independent of each other.

Figure 10:
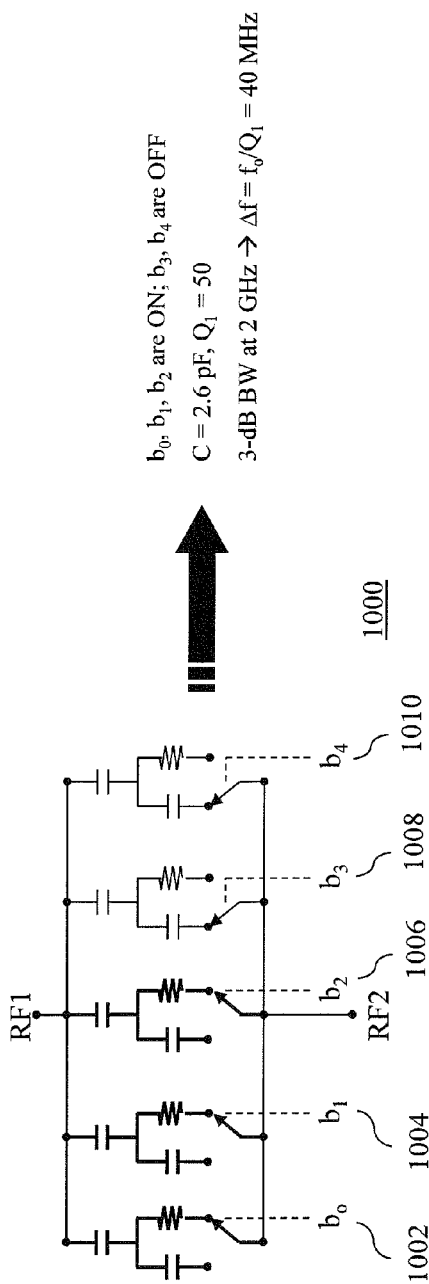
FIGS. 10 and 11 show DTCs that provide a variable Q while maintaining the same capacitance, in accordance with an embodiment of the present disclosure.
Figure 11:
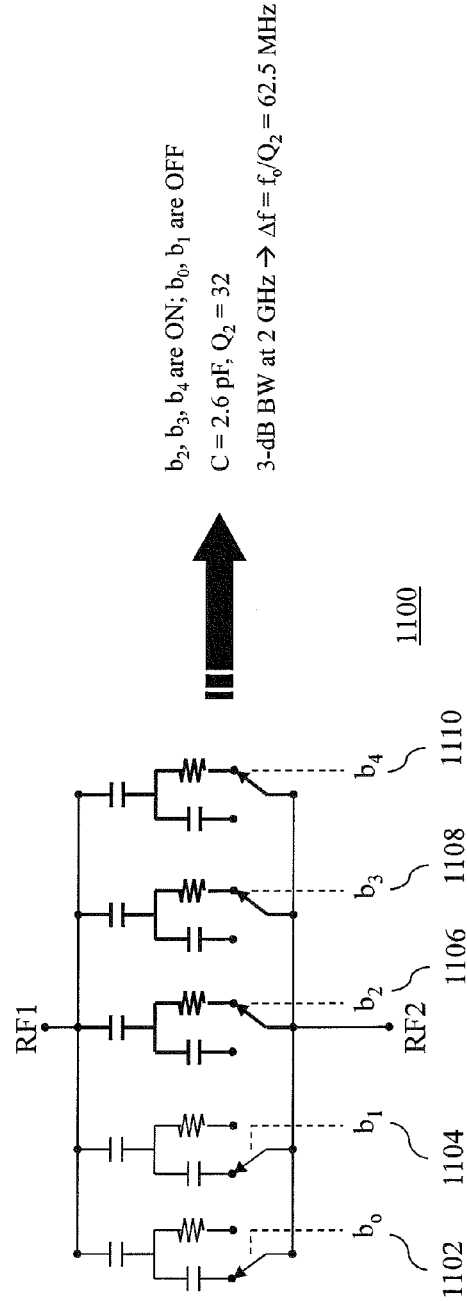

According to several embodiments of the present disclosure, DTCs can comprise multiple states that are associated with a common capacitance value but variable Q. FIGS. 10 and 11 show examples of DTCs that provide different Q values while maintaining the same capacitance in accordance with several embodiments of the present disclosure. Specifically, the DTCs of FIGS. 10 and 11 can be designed such that although capacitance of the DTC remains the same when number of ON switches is the same, the quality factor can vary between these states.

The DTCs (1000, 1100) in FIGS. 10 and 11 both have three ON switches and two OFF switches. For the DTC (1000) in FIG. 10, the switches associated with control bits $b_0$ (1002), $b_1$ (1004), and $b_2$ (1006) are ON, while the switches associated with control bits $b_3$ (1008) and $b_4$ (1010) are OFF. For the DTC (1100) in FIG. 11, the switches associated with control bits $b_2$ (1106), $b_3$ (1108), and $b_4$ (1110) are ON, while the switches associated with control bits $b_0$ (1102) and $b_1$ (1104) are OFF. Because both DTCs (1000, 1100) have only three ON switches, the two DTCs (1000, 1100) have the same total capacitance, 2.6 pF. However, their Q values differ (50 for the DCT (1000) shown in FIG. 10 and 32 for the DTC (1100) shown in FIG. 11) because of the different switch ON-OFF configurations.

If OFF transistors are designated as '0' and ON transistors are designated as '1', a configuration of the five transistors in FIGS. 6, 10, and 11 may be expressed by a numeric control word $b_4b_3b_2b_1b_0$ and/or equivalently as a decimal number, y, defined by $$y=b_4*2^4+b_3*2^3+b_2*2^2+b_1*2^1+b_0*2^0 \quad (20).$$

For example, consider a case where zeroth, first, and fourth control bits are set such that transistors associated with these control bits are ON (e.g., $b_0=b_1=b_4=1$) and second and third control bits are set such that transistors associated with these control bits are OFF (e.g., $b_2=b_3=0$). The numeric control word ($b_4b_3b_2b_1b_0$) can be written as 1001 while y=19 since $1*2^4+0*2^3+0*2^2+1*2^1+1*2^0=19$. In accordance with this example, Table 1 shows the other 31 states possible in the five-bit case.

As previously mentioned, FIG. 8 shows a DTC (800) with exemplary values for coefficients $A_n$ and $B_n$, which are used to scale $R_{ON}$ and $C_{MIM}$ of each bit stage. By using coefficients $A_n$ and $B_n$ to scale $R_{ON}C_{MIM}$ (and thus $R_{ON}C_{MIM}$ are allowed to vary across states), a tapered quality factor across the capacitive tuning range can be achieved, such as previously shown in FIGS. 7A and 7B. Characteristics of the DTC shown in FIG. 8 are shown in each of the graphs that follow in FIGS. 12A through 12E. From the graphs to be shown in FIGS. 12A through 12E, it is noted that each bit stage of the DTC (800) of FIG. 8 contributes a capacitance of 0.5 pF.

Figure 12A:
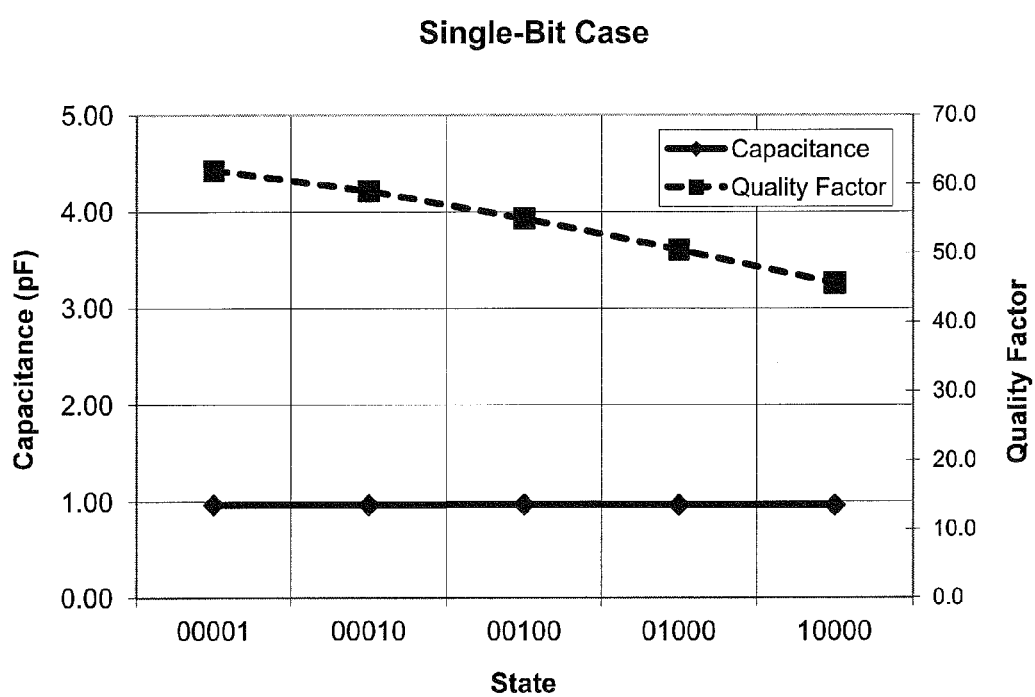
FIGS. 12A-12E show plots of capacitances and Q values as a function of state of a DTC. Specifically.

When only one transistor stack is ON, there are five states (also known as configurations): 00001, 00010, 00100, 01000, and 10000. FIG. 12A shows the capacitances and Q values for DTCs in each of these five states in accordance with an embodiment of the present disclosure. These five states have the same capacitance, around 1 pF, but different Q values. The Q values have a tapered distribution with respect to the states.

Figure 12B:
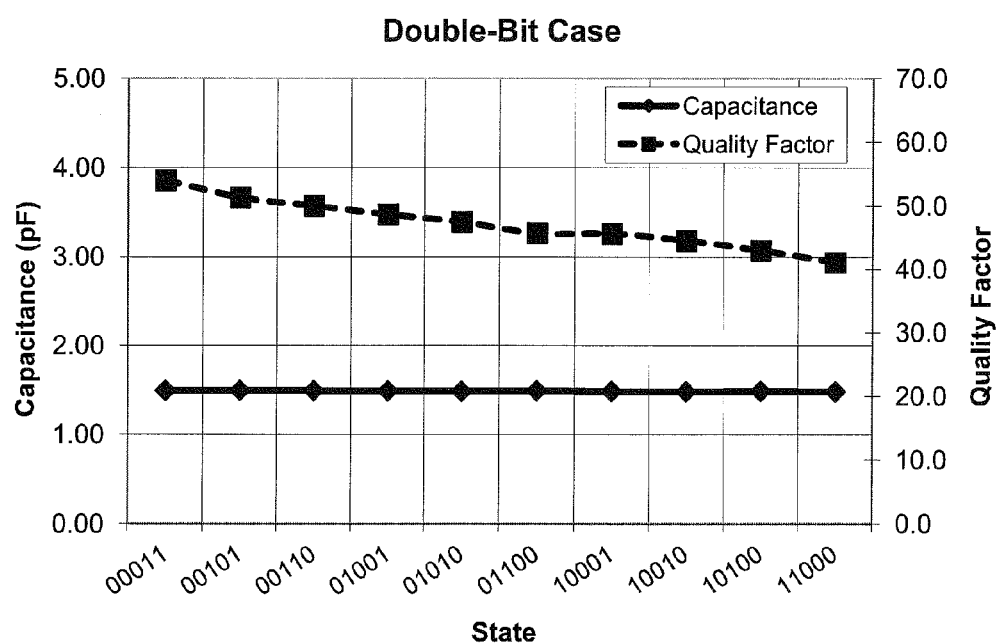

When two of the five transistor stacks are in an ON state (e.g., two of the five control bits are 1's), there are ten states. FIG. 12B shows the capacitances and Q values for DTCs in each of these ten states in accordance with an embodiment of the present disclosure. Likewise, these ten states have the same capacitance, around 1.5 pF, and a tapered distribution of Q values.

Figure 12C:
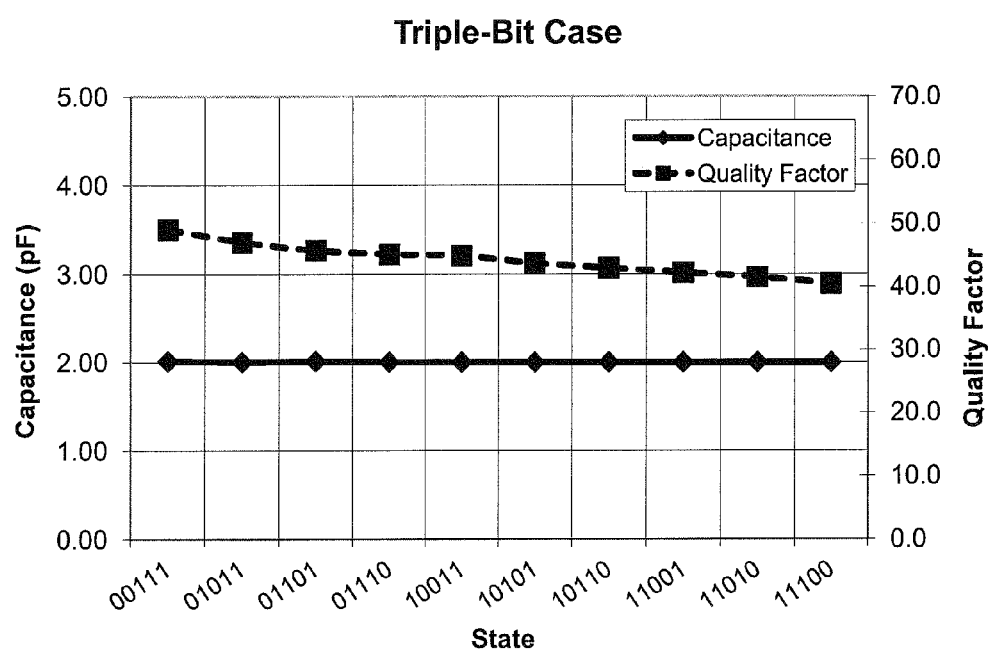

When three of the five transistor stacks are in an ON state (e.g., three of the five control bits are 1's), there are ten states. FIG. 12C shows the capacitances and Q values for DTCs in each of these ten states in accordance with an embodiment of the present disclosure. Similarly, the ten states have the same capacitance, around 2.0 pF, and a tapered distribution of Q values.

Figure 12D:
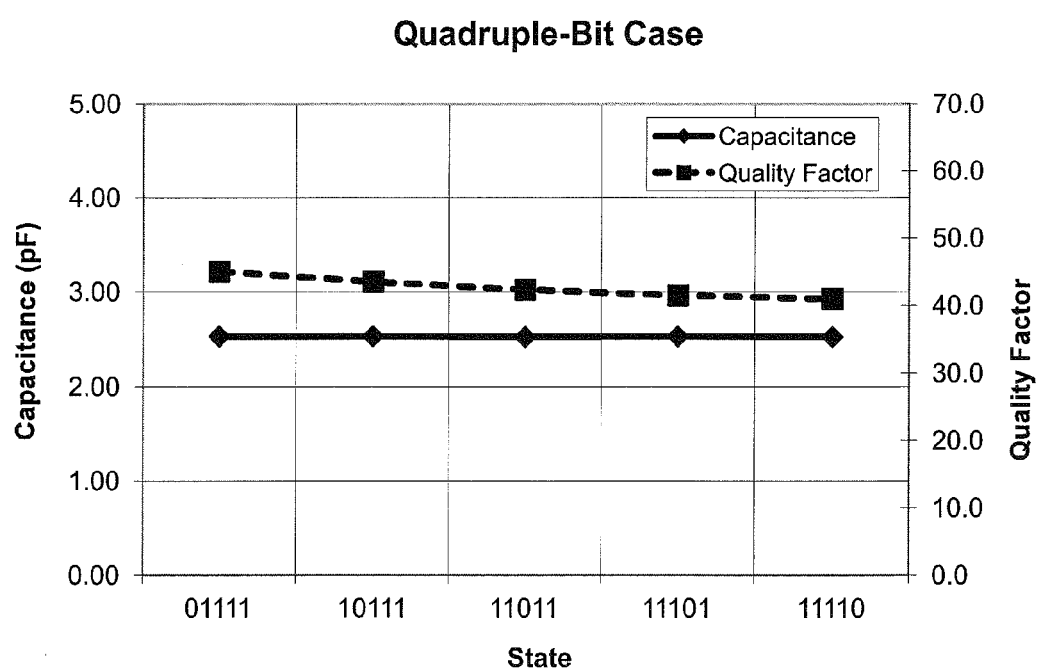

When four of the five transistor stacks are in an ON state (e.g., four of the five control bits are 1's), there are five different states. FIG. 12D shows the capacitances and Q values for DTCs in each of these five states in accordance with an embodiment of the present disclosure. Similarly, the five states have the same capacitance, around 2.5 pF, and a tapered distribution of Q values.

Figure 12E:
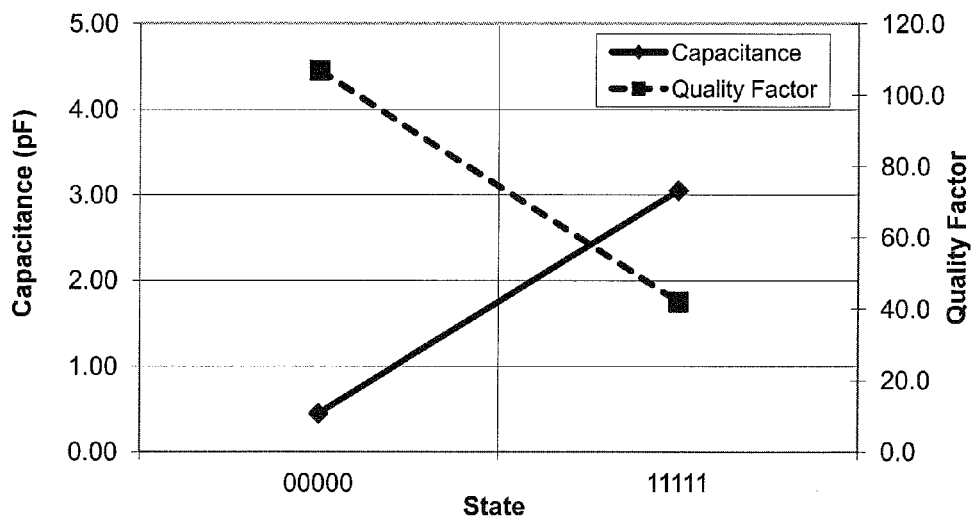

FIG. 12E shows the capacitances and Q values for a zero-bit case (00000) and a penta-bit case (11111), which may signify states of the DTC when all transistors are in an OFF state or ON state, respectively. In the zero-bit case, capacitance of the DTC is due to $C_{OFF}$ of each of the stacks of transistors in series with a corresponding MIM capacitor or capacitors. Due to the serial connections between the capacitances ($C_{OFF}$ and $C_{MIM}$), capacitance of the DTC is lower relative to the case when one or more transistors or stacks of transistors are ON. In FIG. 12E, capacitance for the zero-bit case and the penta-bit case are around 0.5 and 3.0 pF, respectively.

Figure 13:
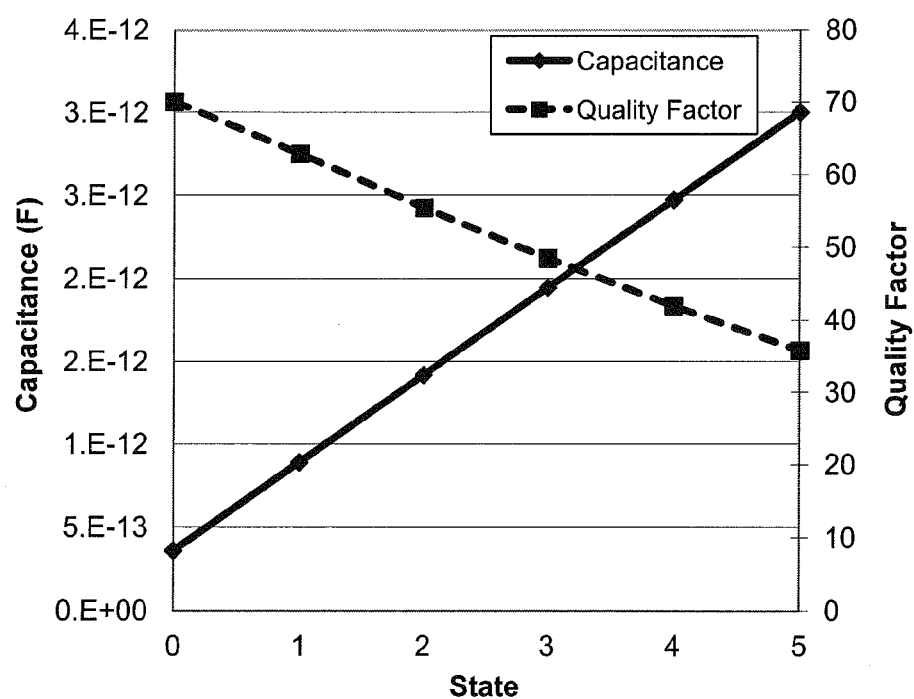
FIG. 13 shows capacitances and Q values for a thermometer coded DTC with tapered Q values.

FIG. 13 shows the capacitances and Q values for a thermometer coded DTC with tapered Q values for the DTC (800) shown in FIG. 8. Because capacitances of a DTC are determined by the number of transistor stacks in an ON state (or equivalently determined by the number of transistor stacks in an OFF state), transistor configurations represented in thermometer coding may be utilized to provide tapered capacitances and Q values. It should be noted that in thermometer coding, a state of 0, 1, 2, 3, 4, and 5 can be represented as numeric control words 00000, 00001, 00011, 00111, 01111, and 11111, respectively. Specifically, FIG. 13 shows the capacitances and Q values for DTCs with these six states.

Additionally, FIG. 13 shows an exemplary tuning range for the DTC's capacitance of around 0.3 pF to 3.0 pF and an exemplary tuning range for the quality factor of around 35 to 70. However, it is noted that these tuning ranges (for both the DTC's capacitance and the quality factor) are highly dependent on the application in which the DTC is to be utilized.

Figure 14:
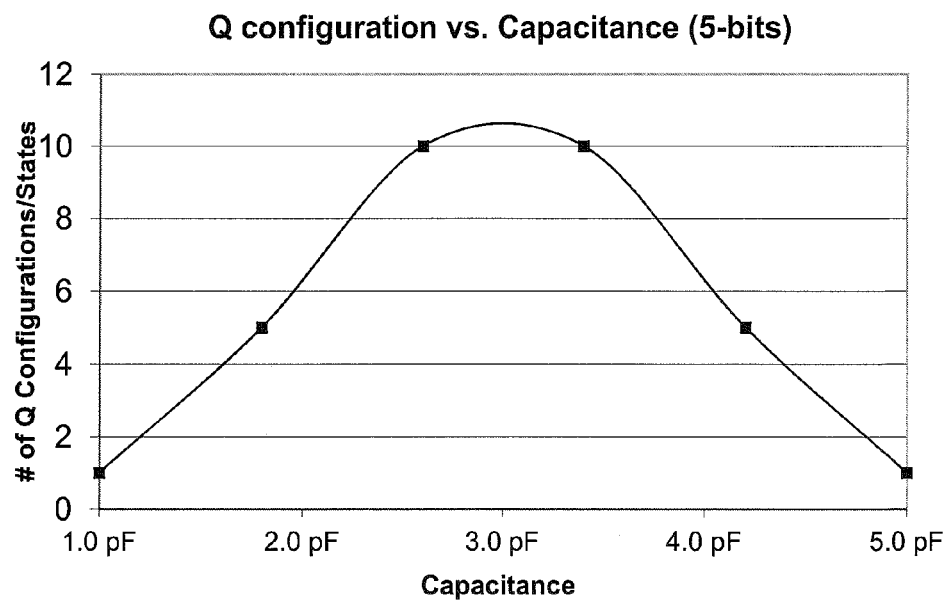
FIG. 14 shows a plot of number of different configurations of Q value at each possible capacitance value for a five-bit DTC, in accordance with an embodiment of the present disclosure.

FIG. 14 shows a plot of number of different configurations of Q value at each possible capacitance value for a five-bit DTC, in accordance to an embodiment of the present disclosure. Table 3 shows exemplary capacitance and Q configurations for a five-bit DTC that are in accordance with the plot shown in FIG. 14. For example, FIG. 14 shows that there are five states for which capacitance of the five-bit DTC is 1.8 pF, where each state can have a different Q value/configuration. Similarly, Table 3 shows that a capacitance of 1.8 pF is associated with arbitrary Q values $Q_1(C=1.8)$ through $Q_5(C=1.8)$, where such Q values can be set (e.g., DTC can be configured to realize such Q values) depending on application. Consequently, as previously mentioned, multiple states can have the same capacitance but be configured with different Q values. It is noted that each bit stage of the five-bit DTC (not shown) associated with FIG. 14 contributes a capacitance of 0.8 pF. Additionally, it should also be noted that, for all states with a common capacitance value, one or more states among these states can have the same Q value.

TABLE 3

Exemplary capacitance and Q configurations for a five-bit DTC

| State | b4 | b3 | b2 | b1 | b0 | C (pF) | Q |
|---|---|---|---|---|---|---|---|
| 0  | 0 | 0 | 0 | 0 | 0 | 1.0 | $Q_1(C = 1.0)$ |
| 1  | 0 | 0 | 0 | 0 | 1 | 1.8 | $Q_1(C = 1.8)$ |
| 2  | 0 | 0 | 0 | 1 | 0 | 1.8 | $Q_2(C = 1.8)$ |
| 3  | 0 | 0 | 0 | 1 | 1 | 2.6 | $Q_1(C = 2.6)$ |
| 4  | 0 | 0 | 1 | 0 | 0 | 1.8 | $Q_3(C = 1.8)$ |
| 5  | 0 | 0 | 1 | 0 | 1 | 2.6 | $Q_2(C = 2.6)$ |
| 6  | 0 | 0 | 1 | 1 | 0 | 2.6 | $Q_3(C = 2.6)$ |
| 7  | 0 | 0 | 1 | 1 | 1 | 3.4 | $Q_1(C = 3.4)$ |
| 8  | 0 | 1 | 0 | 0 | 0 | 1.8 | $Q_4(C = 1.8)$ |
| 9  | 0 | 1 | 0 | 0 | 1 | 2.6 | $Q_4(C = 2.6)$ |
| 10 | 0 | 1 | 0 | 1 | 0 | 2.6 | $Q_5(C = 2.6)$ |
| 11 | 0 | 1 | 0 | 1 | 1 | 3.4 | $Q_2(C = 3.4)$ |
| 12 | 0 | 1 | 1 | 0 | 0 | 2.6 | $Q_6(C = 2.6)$ |
| 13 | 0 | 1 | 1 | 0 | 1 | 3.4 | $Q_3(C = 3.4)$ |
| 14 | 0 | 1 | 1 | 1 | 0 | 3.4 | $Q_4(C = 3.4)$ |
| 15 | 0 | 1 | 1 | 1 | 1 | 4.2 | $Q_1(C = 4.2)$ |
| 16 | 1 | 0 | 0 | 0 | 0 | 1.8 | $Q_5(C = 1.8)$ |
| 17 | 1 | 0 | 0 | 0 | 1 | 2.6 | $Q_7(C = 2.6)$ |
| 18 | 1 | 0 | 0 | 1 | 0 | 2.6 | $Q_8(C = 2.6)$ |
| 19 | 1 | 0 | 0 | 1 | 1 | 3.4 | $Q_5(C = 3.4)$ |
| 20 | 1 | 0 | 1 | 0 | 0 | 2.6 | $Q_9(C = 2.6)$ |
| 21 | 1 | 0 | 1 | 0 | 1 | 3.4 | $Q_6(C = 3.4)$ |
| 22 | 1 | 0 | 1 | 1 | 0 | 3.4 | $Q_7(C = 3.4)$ |
| 23 | 1 | 0 | 1 | 1 | 1 | 4.2 | $Q_2(C = 4.2)$ |
| 24 | 1 | 1 | 0 | 0 | 0 | 2.6 | $Q_{10}(C = 2.6)$ |
| 25 | 1 | 1 | 0 | 0 | 1 | 3.4 | $Q_8(C = 3.4)$ |
| 26 | 1 | 1 | 0 | 1 | 0 | 3.4 | $Q_9(C = 3.4)$ |
| 27 | 1 | 1 | 0 | 1 | 1 | 4.2 | $Q_3(C = 4.2)$ |
| 28 | 1 | 1 | 1 | 0 | 0 | 3.4 | $Q_{10}(C = 3.4)$ |
| 29 | 1 | 1 | 1 | 0 | 1 | 4.2 | $Q_4(C = 4.2)$ |
| 30 | 1 | 1 | 1 | 1 | 0 | 4.2 | $Q_5(C = 4.2)$ |
| 31 | 1 | 1 | 1 | 1 | 1 | 5.0 | $Q_1(C = 5.0)$ |

Figure 15:
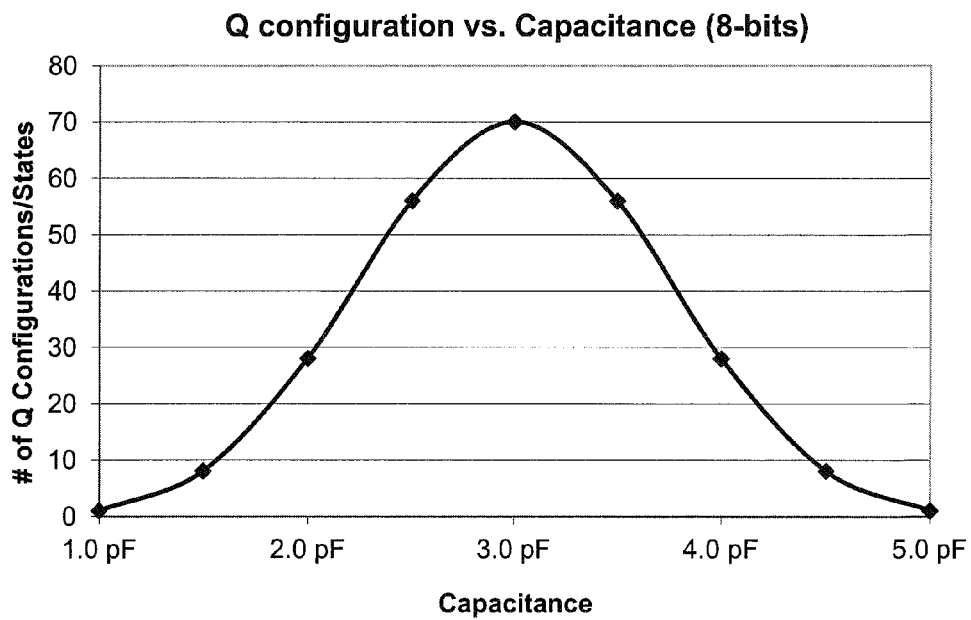
FIG. 15 shows a plot of number of different configurations of Q value at each possible capacitance value for an eight-bit DTC, in accordance to with embodiment of the present disclosure.

FIG. 15 shows a plot of number of different configurations of Q value at each possible capacitance value for an eight-bit DTC, in accordance with an embodiment of the present disclosure. For example, FIG. 15 shows that there are eight states for which capacitance of the eight-bit DTC is 1.5 pF and twenty-eight states for which capacitance of the eight-bit DTC is 2.0 pF, where each state has a different Q value/configuration. It is noted that each bit stage of the eight-bit DTC (not shown) associated with FIG. 15 contributes a capacitance of 0.5 pF.

It is further noted that the number of states associated with a constant capacitance, as shown in both FIGS. 14 and 15, can be obtained by calculating binomial coefficients. Binomial coefficients are given by $$\binom{n}{k} = \binom{n}{n-k} = \frac{2!}{k!(n-k)!} \text{ for } 0 \le k \le n, \quad (21)$$

which is generally read as "n choose k". With reference to FIGS. 14 and 15 as well as equation (21), n can represent number of bit stages in a DTC and k can represent number of bit stages in the DTC that are ON. In the case that k is designated to represent the number of bit stages that are ON (and thus n–k represents the number of bit stages that are OFF), then $$\binom{n}{k}$$

provides number of states where there can be k bit stages of the DTC in an ON state among the total n bit stages present in the DTC.

Since FIGS. 14 and 15 pertain to an embodiment of the present disclosure where states with the same number of bit stages that are ON have the same capacitance value but can be configured with different Q values, $$\binom{n}{k}$$

also provides number of Q configurations at a given capacitance value. For example, consider the eight-bit DTC (not shown) associated with FIG. 15. Consider states where k=3 bit stages are ON. This is the case where only k=3 bit stages among the n=8 bit stages of the eight-bit DTC are turned ON (e.g., k=3 transistor stacks in the DTC are turned ON or n−k=5 transistor stacks in the DTC are turned OFF) and is associated with a capacitance of 2.5 pF. Number of states with k=3 is given by $$\binom{n}{k} = \binom{8}{3} = 56,$$

as also shown in FIG. 15. Therefore, in this example, for a capacitance value of 2.5 pF, the eight-bit DTC has 56 Q configurations. Results for FIG. 14 can also be derived similarly based on equation (21) with n=5.

Figure 16:
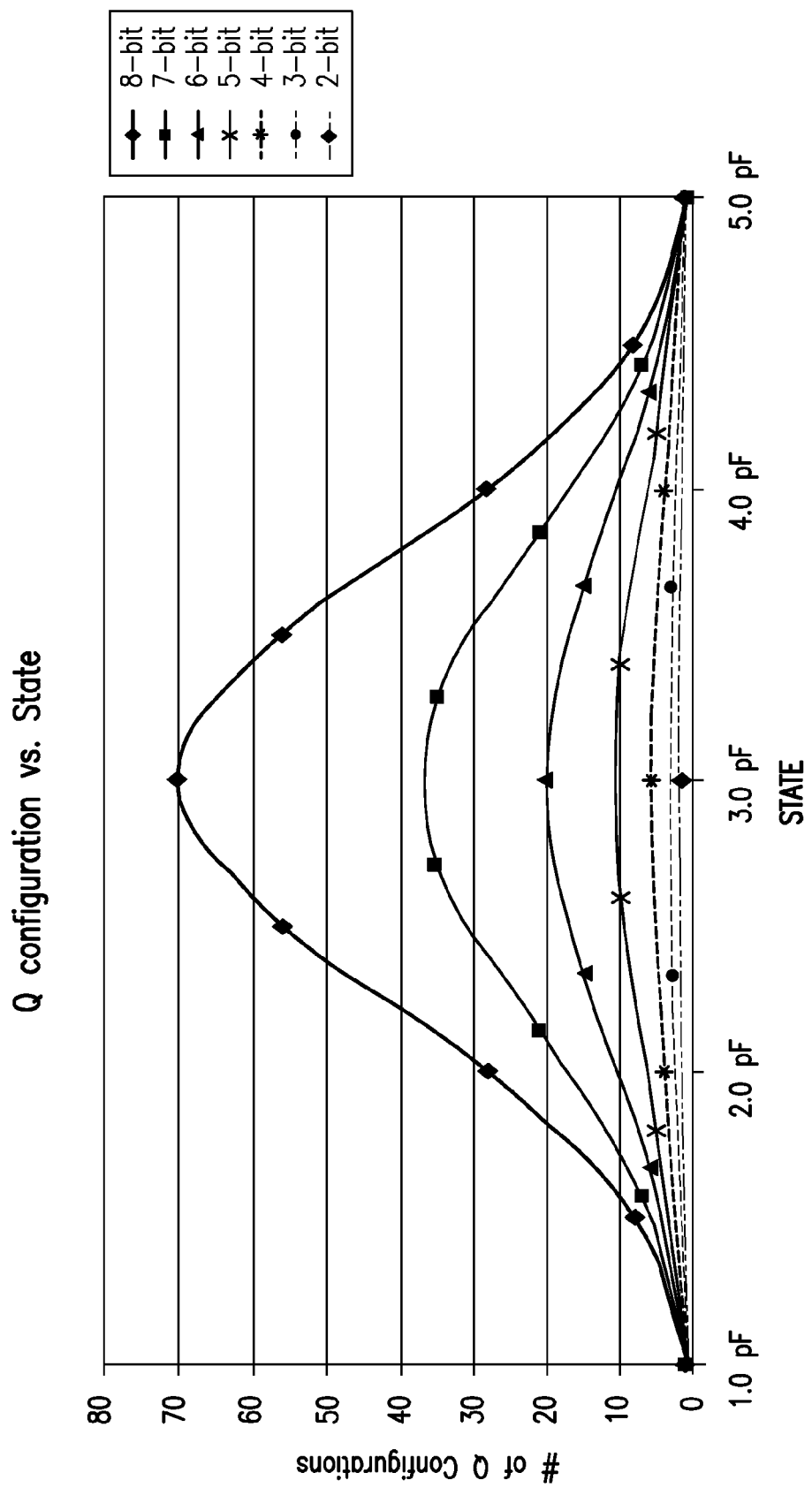
FIG. 16 shows a plot of number of different configurations of Q value at each possible capacitance value for DTCs with two-bit, three-bit, four-bit, five-bit, six-bit, seven-bit, and eight-bit configurations, in accordance with several embodiments of the present disclosure.

FIG. 16 shows the number of different states with respect to capacitances for DTCs with two-bit, three-bit, four-bit, five-bit, six-bit, seven-bit, and eight-bit configurations, in accordance with several embodiments of the present disclosure. As with number of states shown in FIGS. 14 and 15, the number of states under a constant capacitance shown in FIG. 16 can be obtained by calculating binomial coefficients.

With reference to FIG. 16, the higher the number of bits, the more number of different Q configurations can generally be obtained for a fixed C value. According to several embodiments of the present disclosure, a tunable filter can be thus designed, because the bandwidth of the DTC is dependent on Q. If a sharper/tighter bandwidth is desired, a configuration with a higher Q can be utilized. On the other hand, if a large bandwidth is desired, a configuration with a lower Q can be utilized.

Whereas each bit stage of DTCs described above comprises a capacitance $A_n C_{MIM}$ that is fixed in value and a switching device connected to the capacitance, according to many embodiments of the present disclosure, capacitance and switching device in one or more bit stages can also be implemented with an inherently variable capacitance. Specifically, any particular bit stage can comprise an inherently variable capacitance without a connected switching device or can comprise an inherently variable capacitance connected with a switching device. An inherently variable capacitance of a bit stage can be realized through use of, for example, a varactor diode, a metal-oxide-semiconductor (MOS) capacitor, and a varactor dielectric such as barium strontium titanate (BST) film, among other variable capacitors known to a person skilled in the art.

Varactors are generally utilized as voltage-controlled capacitors, where a varactor diode and a varactor dielectric are examples of varactors or are examples of components of varactors. The varactor diode is generally a pn junction diode whose capacitance and series resistance change with voltage applied to the varactor diode. It is noted that the varactor diode is generally operated in reverse-bias so that negligible (ideally no) current flows. In such a case, capacitance of the varactor diode can be modeled similar to junction capacitance $C_j$ of a pn junction diode, which can be given by:

$$C_j = \frac{C_{j0}}{\left(1 + \frac{V_R}{V_0}\right)^m}, \tag{22}$$

where $V_0$ is a junction built-in voltage, $V_R$ is a reverse-bias voltage applied to the pn junction diode, $C_{j0}$ is junction capacitance value at zero applied voltage (i.e., $V_R$=0), and m is a grading coefficient. Value of the grading coefficient m is a function of manner in which doping density changes between the p side of the pn junction and the n side of the pn junction, as is well known by a person skilled in the art. The varactor diode can thus be designed such that capacitance of the varactor diode can be made to be a stronger function of voltage applied to the pn junction diode by increasing the grading coefficient (e.g., designing a varactor diode to have an m of 3 or 4). Consequently, a varactor diode can be utilized as a voltage-controlled capacitor and can be employed in a bit stage of a DTC.

A MOS capacitor is another example of a varactor. The MOS capacitor can be modeled as a capacitor formed of a metal layer, a semiconductor layer, and an insulator layer that acts as a dielectric material between the metal and semiconductor layers. In a CMOS process, for example, the metal layer can be formed by poly-silicon and referred to as a gate, the semiconductor layer can be formed by silicon and referred to as a body or substrate, and the insulating layer can be formed by silicon dioxide and referred to as an oxide layer. Capacitance of the MOS capacitor can be tuned based on voltage applied to the gate of the MOS capacitor. The MOS capacitor can be implemented, for instance, by a gate capacitance of a MOS transistor.

Another example of a varactor is a capacitor that utilizes a varactor dielectric, where dielectric constant of the varactor dielectric is a function of voltage applied to the varactor dielectric (and thus is a function of voltage applied to the capacitor). By way of example and not of limitation, a BST film can be utilized as a varactor dielectric. The BST film is a ferroelectric material, where a ferroelectric material has a dielectric constant that is a function of an electric field applied (and thus is a function of a voltage applied) to the ferroelectric material. Consequently, as an example, a parallel-plate capacitor with a BST film between the plates can present a capacitance that is a function of a voltage applied to the parallel-plate capacitor due to use of the BST film as the dielectric material. Aside from ferroelectric materials such as a BST film, non-ferroelectric materials such as a bismuth zinc niobate (BZN) film can also be utilized as a varactor dielectric.

As previously mentioned, other examples of varactors or otherwise other examples of variable capacitors are identifiable by a person skilled in the art. Such variable capacitors can be employed in one or more bit stages of a DTC, in accordance with many embodiments of the present disclosure, and can be (but need not be) connected with one or more switching devices. For example, in a case where $(R_{ON}/B_n)(A_n C_{MIM})$ remains constant across bit stages of a DTC, capacitance values of the fixed and variable capacitors can be configured accordingly to achieve a constant $(R_{ON}/B_n)(A_n C_{MIM})$ across the bit stages. However, the same DTC can also be configured to realize a case where $(R_{ON}/B_n)(A_nC_{MIM})$ is not a constant by tuning capacitance of the variable capacitors.

Figure 17:
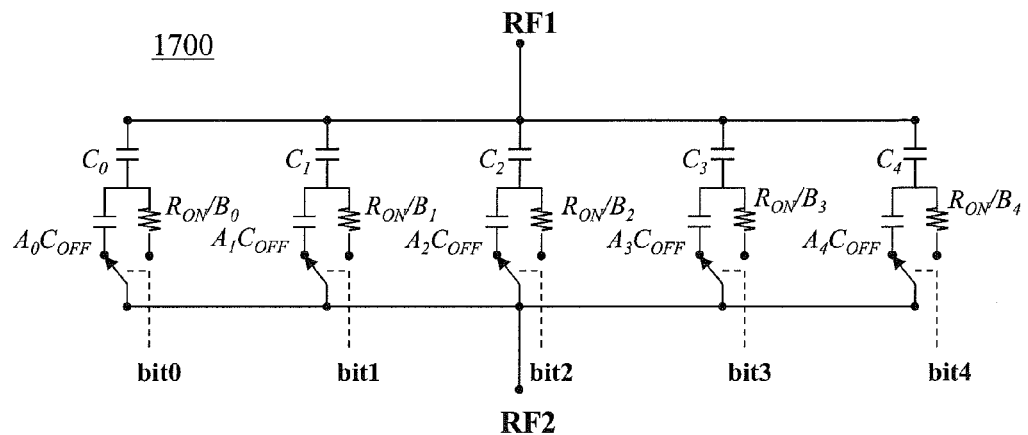
FIG. 17 shows an embodiment of a DTC that comprises capacitors connected with switching devices. Any one, plurality, or all of the capacitors and connected switching device pairs, which form a bit stage, shown in FIG. 17 can be implemented using a voltage or current dependent variable capacitor.

FIG. 17 shows an embodiment of a DTC (1700) that comprises capacitors connected with switching devices. Any one, a plurality, or all of the capacitors and connected switching device pairs, which form a bit stage, can be implemented using a voltage or current dependent variable capacitor. As previously mentioned, a varactor diode, a MOS capacitor, and/or a capacitor employing a varactor dielectric such as a BST film, among other variable capacitors known to a person skilled in the art can be used instead of a fixed capacitance or can be used instead of a fixed capacitance connected with a switching device.

Capacitance exhibited by varactors (e.g., varactor diodes, MOS capacitors, BST films) is generally a function of size of the varactors, and as such a broad range of nominal capacitance values is possible depending on size that can be allocated to the varactors. Voltage that is applied to varactors is generally specific to a technology. For example, a varactor diode can be dependent on voltages applied at one or both terminals RF1 and RF2 shown in FIG. 18 whereas BST films can depend on voltage applied at a third terminal (not shown). A person skilled in the art can identify manners by which to apply control voltages/currents and control capacitances exhibited by voltage and/or current dependent capacitors. Furthermore, different metallization patterns or schema for the variable capacitors, identifiable by a person skilled in the art, can influence Q value for a given capacitance value.

Figure 18:
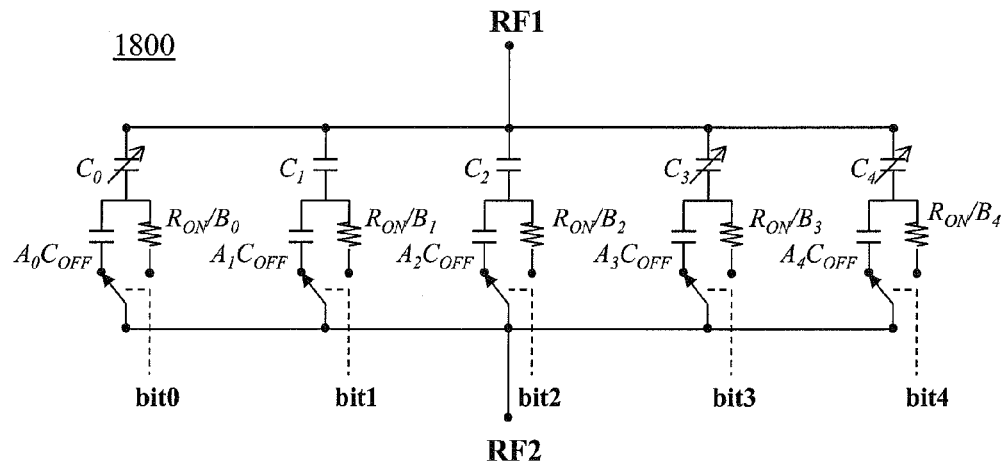
FIGS. 18 and 19 show additional embodiments of DTCs that comprise fixed and variable capacitors.

FIG. 18 shows a DTC (1800) where capacitances $C_0$, $C_3$, and $C_4$ of a zeroth, third, and fourth bit stage, respectively, are variable and capacitances $C_1$ and $C_2$ of a first and second bit stage, respectively, are fixed. Use of a variable capacitance in a DTC may be for tunability in addition to tunability provided by discrete capacitance values provided by the DTC. For example, with reference to FIG. 18, the fixed capacitances $C_1$ and $C_2$ can be 10 pF and 20 pF, respectively. The variable capacitances $C_0$, $C_3$, and $C_4$ can be utilized for finer tuning around capacitance values of these fixed capacitances. It is noted that the combination of fixed and variable capacitances shown in FIG. 18 is an example. More or fewer of the capacitances $C_0$ through $C_4$ can be fixed capacitances or variable capacitances than the combination shown in FIG. 18. In some cases, all capacitors connected with switching arrangements can be variable capacitances.

Figure 19:
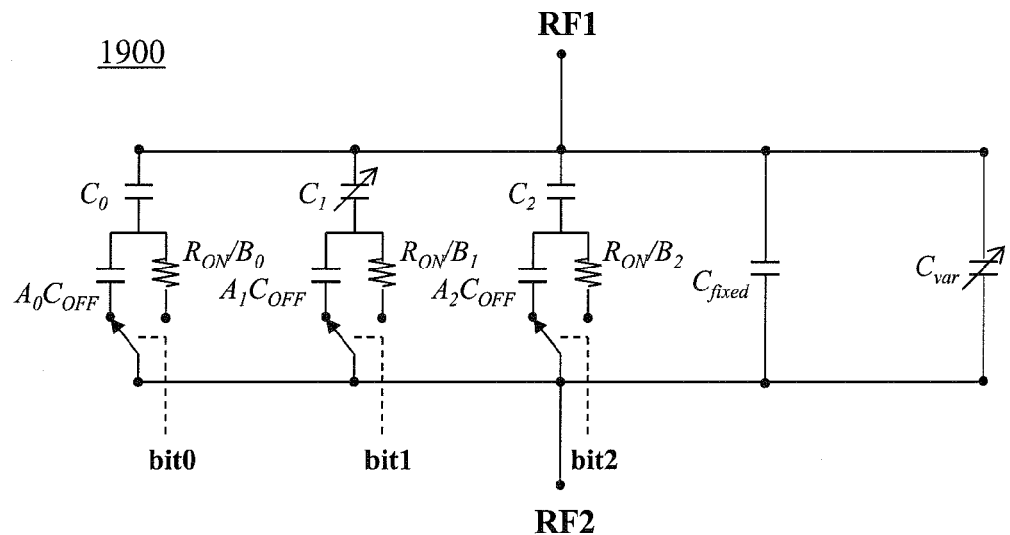

FIG. 19 shows a DTC (1900) where a zeroth and second bit stage comprise a fixed capacitor connected with a switching device (bit stages with $C_0$ and $C_2$), a first bit stage comprises a variable capacitor connected with a switching device (bit stage with $C_1$), a third bit stage comprises a fixed capacitor, and a fourth bit stage comprises a variable capacitor. As mentioned previously with reference to several embodiments of the present disclosure, additional bit stages, switching devices, fixed capacitors, and/or variable capacitors can be employed in the DTC (1900) as needed based on application.

As previously mentioned, field effect transistors (FETs) are utilized as switching devices for discussion purposes. However, the present disclosure can also utilize other switching devices such as accumulated charge control field effect transistors, microelectromechanical system (MEMS) switches, diodes, diode connected bipolar junction transistors (BJTs), and other switching devices identifiable by a person skilled in the art.

A switch such as an MEMS switch may be utilized. For MEMS switches, $R_{on}$ and $C_{off}$ are generally low over the range of typical operating frequencies. MEMS switches are generally packaged in hermetic packages and involve higher voltages such as 30-50 V to activate. MEMS switches generally have high performance and may be utilized, for instance, in medical or instrumentation equipment.

As another example, in some embodiments, FETs can be implemented in accordance with improved process and integrated circuit design advancements. One such advancement comprises the so-called "HaRP™" technology enhancements developed by the assignee of the present application. The HaRP enhancements provide for new RF architectures and improved linearity in RF front end solutions. FETs made in accordance with the HaRP enhancements are described in pending applications and patents owned by the assignee of the present application. For example, FETs made in accordance with the HaRP enhancements are described in U.S. Pat. No. 7,910,993, issued Mar. 22, 2011, and U.S. Pat. No. 8,129,787, issued on Mar. 6, 2012, both of which are entitled "Method and Apparatus for use in Improving Linearity of MOSFETs Using an Accumulated Charge Sink"; and in pending U.S. patent application Ser. No. 13/277,108, filed on Oct. 19, 2011, and Ser. No. 13/412,529, filed on Mar. 5, 2012. Disclosures in each of U.S. Pat. Nos. 7,910,993 and 8,129,787 as well as pending U.S. patent application Ser. Nos. 13/277,108 and 13/412,529 is incorporated herein by reference in its entirety.

More specifically, and as described in the aforementioned patents and pending patent applications, FETs made in accordance with HaRP technology enhancements comprise Accumulated Charge Control (ACC) SOI MOSFETs, where each ACC SOI MOSFET includes an Accumulated Charge Sink (ACS) coupled thereto which is used to remove accumulated charge from the ACC FET body when the FET operates in an accumulated charge regime. The ACS facilitates removal or otherwise controls the accumulated charge when the ACC SOI MOSFET operates in the accumulated charge regime. Thus, the HaRP technology enhancements provide a method and apparatus for use in improving linearity characteristics of MOSFET devices using the accumulated charge sink (ACS).

Via the ACS terminal, the HaRP FETs are adapted to remove, reduce, or otherwise control accumulated charge in SOI MOSFETs, thereby yielding improvements in FET performance characteristics. In one exemplary implementation, a circuit having at least one SOI MOSFET is configured to operate in an accumulated charge regime. The ACS is operatively coupled to the body of the SOI MOSFET, and eliminates, removes, or otherwise controls accumulated charge when the FET is operated in the accumulated charge regime, thereby reducing the nonlinearity of the parasitic off-state source-to-drain capacitance of the SOI MOSFET. In RF switch circuits implemented with the improved SOI MOSFET devices, harmonic and intermodulation distortion can be reduced by removing or otherwise controlling the accumulated charge when the SOI MOSFET operates in an accumulated charge regime.

Figure 20:
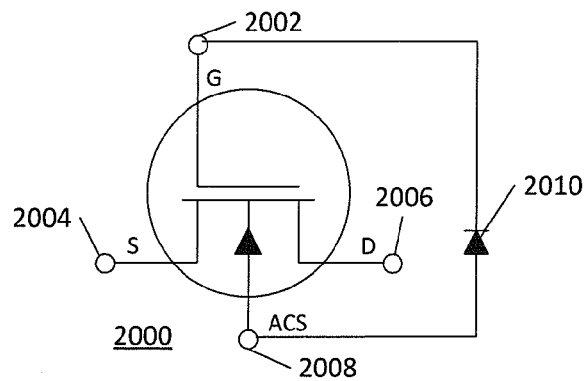
FIG. 20 is a simplified schematic of an SOI NMOSFET adapted to control accumulated charge, embodied as a four terminal device, where an accumulated charge sink (ACS) terminal is coupled to a gate terminal via a diode.

In some implementations as described in the aforementioned patents and pending patent applications, the ACC MOSFET comprises as a four terminal device, where an accumulated charge sink (ACS) terminal is coupled to a gate terminal via a diode. One such four terminal ACC MOSFET (2000) is shown in FIG. 20. FIG. 20 is a simplified schematic of an SOI NMOSFET (2000) adapted to control accumulated charge, embodied as a four terminal device, where the ACC MOSFET (2000) includes a gate terminal (2002), source terminal (2004), drain terminal (2006), and accumulated charge sink (ACS) terminal (2008).

As shown in the implementation of FIG. 20, the ACS terminal (2008) is coupled to the gate terminal (2002) via a diode (2010). This implementation may be used to prevent a positive current flow into the body of the MOSFET (2000)

caused by a positive Vg-to-Vs (or, equivalently, Vgs, where Vgs=Vg−Vs) bias voltage, as may occur, for example, when the ACC MOSFET (2000) is biased into an on-state condition. When biased off, the ACS terminal voltage $V_{ACS}$ comprises the gate voltage plus a voltage drop across the diode (2010). At very low ACS terminal current levels, the voltage drop across the diode (2010) typically also is very low (e.g., <<500 mV, for example, for a typical threshold diode). The voltage drop across the diode (2010) may be reduced to approximately zero by using other diodes, such as a 0 Vf diode, for example. In one implementation, reducing the voltage drop across the diode is achieved by increasing the diode (2010) width. Additionally, maintaining the ACS-to-source or ACS-to-drain voltage (whichever bias voltage of the two bias voltages is lower) increasingly negative can also improve the linearity of the ACC MOSFET device (2000).

More details and examples of Accumulated Charge Control (ACC) SOI MOSFETs as well as circuits employing such ACC SOI MOSFETs are provided in the disclosures of U.S. Pat. Nos. 7,910,993 and 8,129,787 as well as pending U.S. patent application Ser. Nos. 13/277,108 and 13/412,529, each of which is incorporated herein by reference in its entirety. In many implementations, each ACC SOI MOSFET includes an Accumulated Charge Sink (ACS) coupled thereto which is used to remove accumulated charge from the ACC FET body when the FET operates in an accumulated charge regime. The ACS facilitates removal or otherwise controls the accumulated charge when the ACC SOI MOSFET operates in the accumulated charge regime. Thus, a method and apparatus for use in improving linearity characteristics of MOSFET devices using the accumulated charge sink (ACS) is provided. Via the ACS terminal, the ACC SOI MOSFETs are adapted to remove, reduce, or otherwise control accumulated charge in SOI MOSFETs, thereby yielding improvements in FET performance characteristics. In one exemplary implementation, a circuit having at least one SOI MOSFET is configured to operate in an accumulated charge regime. The ACS is operatively coupled to the body of the SOI MOSFET, and eliminates, removes, or otherwise controls accumulated charge when the FET is operated in the accumulated charge regime, thereby reducing the nonlinearity of the parasitic off-state source-to-drain capacitance of the SOI MOSFET. In RF switch circuits implemented with the improved SOI MOSFET devices, harmonic and intermodulation distortion can be reduced by removing or otherwise controlling the accumulated charge when the SOI MOSFET operates in an accumulated charge regime.

As previously mentioned, it is again noted that although lumped elements (e.g., discrete resistors, capacitors, and inductors) are depicted throughout the present disclosure, the embodiments of the present disclosure can also utilize distributed elements. Specifically, resistances, capacitances, and inductances can be distributed throughout a circuital arrangement and thus can be generally measured per unit length (e.g., Ω/length, F/length, and H/length, respectively). For example, transmission line elements such as half-wavelength, quarter-wavelength, series and parallel stubs (open circuit or short circuit stubs), and resonant stubs can also be utilized to provide resistances and reactances to the circuital arrangement. It should be noted that the various elements (either lumped or distributed) can be on-chip or off-chip.

The examples set forth above are provided to give those of ordinary skill in the art a complete disclosure and description of how to make and use the embodiments of the digitally tuned capacitors with tapered and reconfigurable quality factors of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A digitally tuned capacitor (DTC) adapted for use in a circuit device, comprising:
   a first terminal;
   a second terminal; and
   a plurality of bit stages in parallel between the first terminal and the second terminal, each bit stage comprising at least one switch connected with at least one capacitor,
   wherein:
      the plurality of bit stages is configured to be controlled by a numeric control word in binary representation, each bit of the numeric control word representing a switching state of one bit stage in the plurality of bit stages, wherein the switching state is either an ON state or an OFF state, and
      states of the DTC with same number of ON states is configured to provide a variable quality factor while maintaining a constant or near constant capacitance around a fixed level.

2. The DTC according to claim 1, wherein the DTC is configured to provide one or more quality factors in a tapered distribution and a constant capacitance in response to one or more switching states of the numeric control word, the one or more switching states having the same number of bits that represent ON states.

3. The DTC according to claim 1, wherein the DTC is configured to provide one or more capacitances in a tapered distribution and one or more quality factors in a tapered distribution in response to one or more switching states of the numeric control word, the one or more switching states being binary coded.

4. The DTC according to claim 1, wherein the DTC is configured to provide one or more capacitances in a tapered distribution and one or more quality factors in a tapered distribution in response to one or more switching states of the numeric control word, the one or more switching states being thermometer-coded.

5. The DTC according to claim 1, wherein the DTC is configured to provide one or more capacitances in a tapered distribution and one or more quality factors in a tapered distribution, wherein higher capacitance values in the one or more capacitances are associated with lower quality factors in the one or more quality factors.

6. The DTC according to claim 1, wherein the DTC is configured to provide one or more capacitances in a tapered distribution and one or more quality factors in a tapered distribution, wherein lower capacitance values in the one or more capacitances are associated with lower quality factors in the one or more quality factors.

7. The DTC according to claim 1, wherein each bit stage is associated with a quality factor and number of switches in the at least one switch of each bit stage is a function of the quality factor.

8. The DTC according to claim 7, wherein number of switches is lower in a bit stage that, when in an ON state, is associated with a higher quality factor than in a bit stage that, when in an ON state, is associated with a lower quality factor.

9. The DTC according to claim 1, wherein:
the at least one switch in a particular bit stage, when in an ON state, is associated with an ON resistance; and
capacitance value of the at least one capacitor in the particular bit stage is a function of the ON resistance.

10. The DTC according to claim 1, wherein:
the at least one switch in a particular bit stage, when in an ON state, is associated with an ON resistance; and
the ON resistance of the particular bit stage is a function of capacitance value of the at least one capacitor in the particular bit stage.

11. The DTC according to claim 1, wherein:
the at least one switch in a particular bit stage, when in an ON state, is associated with an ON resistance; and
the ON resistance of the particular bit stage is a function of capacitance value of the at least one capacitor in one or more other bit stages among the plurality of bit stages.

12. The DTC according to claim 1, wherein
the at least one switch in a particular bit stage, when in an ON state, is associated with an ON resistance; and
the ON resistance of the particular bit stage is a function of a difference between capacitance value of the at least one capacitor in the particular bit stage and the at least one capacitor in one or more other bit stages among the plurality of bit stages.

13. The DTC according to claim 1, wherein equivalent capacitance of the at least one capacitor in one bit stage is equal to equivalent capacitance of the at least one capacitor in each remaining bit stage.

14. The DTC according to claim 1, wherein each switch among the at least one switch in each bit stage is a microelectromechanical system switch, a diode, a diode connected bipolar junction transistor, a field effect transistor, or an accumulated charge control field effect transistor.

15. The DTC according to claim 1, wherein each capacitor among the at least one capacitor in each bit stage is a fixed capacitor or a variable capacitor.

16. The DTC according to claim 15, wherein a capacitor among the at least one capacitor in a particular bit stage is a variable capacitor, the variable capacitor comprising a varactor diode or a varactor dielectric.

17. A method of digitally tuning a tunable capacitor in a circuit device, comprising:
providing a first terminal;
providing a second terminal;
providing a plurality of bit stages connected in parallel between the first terminal and the second terminal, each bit stage comprising at least one switch connected with at least one capacitor;
applying a numeric control word in binary representation to the plurality of bit stages, each bit of the numeric control word representing a switching state of one bit stage in the plurality of bit stages, wherein the switching state is either an ON state or an OFF state;
selectively controlling capacitance between the first terminal and the second terminal based on switching states of each bit stage in the plurality of bit stages; and
configuring states of the tunable capacitor with same number of ON states to provide a variable quality factor while maintaining a constant or near constant capacitance around a fixed level.

18. The method according to claim 17, wherein the numeric control word to be applied to the plurality of bit stages is based on quality factor to be provided by the tunable capacitor.

19. The method according to claim 17, wherein the numeric control word to be applied to the plurality of bit stages is based on voltages to be applied to the first and/or second terminals.

20. The method according to claim 17, wherein each switch among the at least one switch in each bit stage is a microelectromechanical system switch, a diode, a diode connected bipolar junction transistor, a field effect transistor, or an accumulated charge control field effect transistor.

21. The method according to claim 17, wherein each capacitor among the at least one capacitor in each bit stage is a fixed capacitor or a variable capacitor.

22. The method according to claim 21, wherein a capacitor among the at least one capacitor in a particular bit stage is a variable capacitor, the variable capacitor comprising a varactor diode or a varactor dielectric.

\* \* \* \* \*